United States Patent [19]

Nakanishi et al.

[11] Patent Number: 5,508,522

[45] Date of Patent: Apr. 16, 1996

[54] METHOD FOR PRODUCING A GROUP II-VI COMPOUND SEMICONDUCTOR THIN FILM AND A GROUP II-VI COMPOUND SEMICONDUCTOR DEVICE

[75] Inventors: Kenji Nakanishi, Chiba; Masahiko Kitagawa, Tottori; Yoshitaka Tomomura, Nara; Shinya Hirata, Tenri, all of Japan

[73] Assignee: Sharp Kabushiki Kaisha, Osaka, Japan

[21] Appl. No.: 169,299

[22] Filed: Dec. 17, 1993

[30] Foreign Application Priority Data

| Dec. 17, 1992 | [JP] | Japan | 4-337097 |
| Dec. 25, 1992 | [JP] | Japan | 4-345013 |
| Mar. 30, 1993 | [JP] | Japan | 5-071781 |
| May 19, 1993 | [JP] | Japan | 5-116901 |

[51] Int. Cl.$^6$ .................................................. H01L 29/06
[52] U.S. Cl. .............................. 257/13; 257/94; 257/103; 257/201; 257/627; 257/628
[58] Field of Search .................................... 257/627, 628, 257/13, 94, 97, 103, 201; 372/43; 437/126, 129

[56] References Cited

U.S. PATENT DOCUMENTS

| 4,987,472 | 1/1991 | Endo et al. | 257/628 |
| 5,016,252 | 5/1991 | Hamada et al. | 257/628 |

OTHER PUBLICATIONS

Haase, M. A., et al.,"Blue–green laser diodes" *Appl. Phys. Lett.* (1991) 59(11): 1272–1274.

Ichino, K., et al., "Design and fabrication of II–VI semiconductor heterostructures" *OYO BUTURI* (A monthly publication of The Japan Society of Applied Physics) (1992) 61(2): 117–125.

*Primary Examiner*—Sara W. Crane
*Attorney, Agent, or Firm*—Morrison & Foerster

[57] ABSTRACT

A method for fabricating a semiconductor thin film is disclosed. The method includes the step of epitaxially growing a semiconductor layer made of a group II-VI compound semiconductor to have a thickness of at least one atomic layer or more, on a main plane of a single-crystal semiconductor substrate, the semiconductor substrate having one of a diamond structure and a zinc blende structure, the main plane being inclined by an angle in the range of 2 to 16 degrees with respect to a (100) plane.

17 Claims, 10 Drawing Sheets

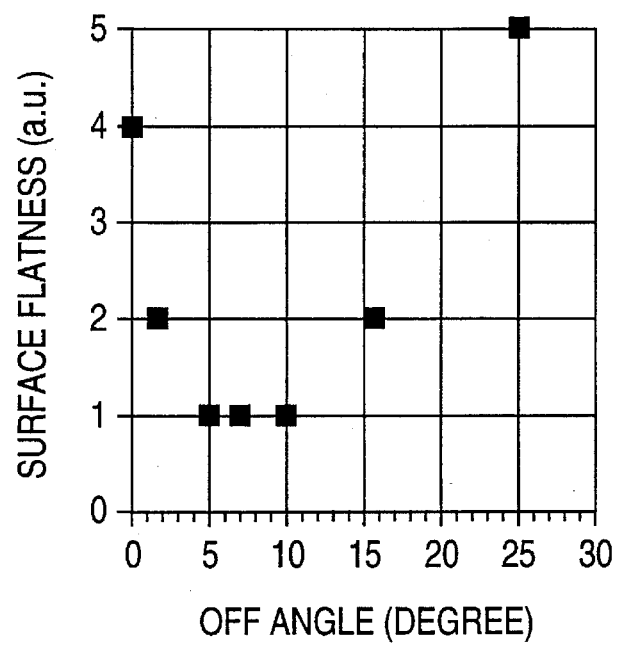
FIG. 5
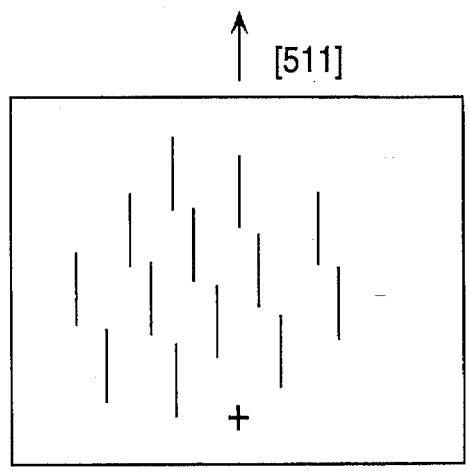 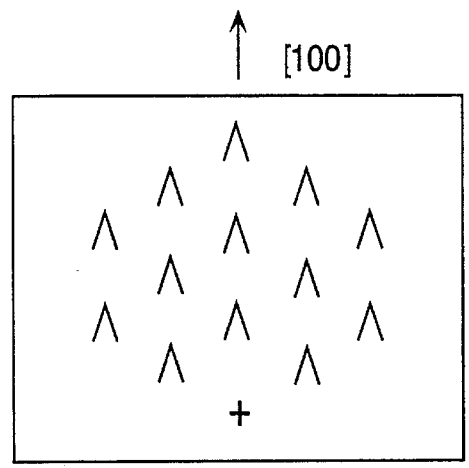
FIG. 6A  FIG. 6B

METHOD FOR PRODUCING A GROUP II-VI COMPOUND SEMICONDUCTOR THIN FILM AND A GROUP II-VI COMPOUND SEMICONDUCTOR DEVICE

BACKGROUND OF THE INVENTION

1. Field of the Invention

The present invention relates to a method of fabricating a group II-VI compound semiconductor thin film, and a group II-VI compound semiconductor device. More particularly, the present invention relates to a semiconductor device having a semiconductor layer made of a material of ZnCdSSe type.

2. Description of the Related Art

A blue-light-emitting diode and a semiconductor laser emitting blue light are extremely useful for light sources in various opto-electronics apparatus such as a full-color display device, a high-density information processing device, and a photo-chemical reacting processing device. Thus, in recent years, such a blue-light-emitting diode and a semiconductor laser emitting blue light have been intensively investigated.

In a conventional group II-VI compound semiconductor device, a single-crystal substrate made of a group III-V semiconductor such as GaAs, or GaP, or a group II-VI single-crystal semiconductor such as ZnS, or ZnSe is used. On the substrate, a single-crystal semiconductor layer having a multi-layer structure made of a group II-VI compound semiconductor is deposited by molecular-beam epitaxy (MBE), metalorganic chemical vapor deposition (MOCVD), or the like. Since a (100) single-crystal substrate is inexpensive and easily available, it is most widely used for the substrate on which the group II-VI compound semiconductor single-crystal thin film is grown (for example, M. A. Haase et al., *Appl. Phys. Lett.* 59, 1272 (1991)).

A substrate having a (111)A plane and a substrate having a (111)B plane are also easily available, so that the growth of a group II-VI compound semiconductor thin film on such a substrate has been investigated. However, the group II-VI compound semiconductor thin film is grown on the substrate having a (111)A plane or the substrate having a (111)B plane in a twin-crystal state. This means that a good group II-VI compound semiconductor thin film cannot be obtained. Hitherto, the growth of such a semiconductor thin film on substrates having other orientation planes than (100), (111)A, and (111)B planes have not been investigated.

FIG. 16 shows a cross-sectional construction of a conventional current injection type semiconductor laser device 720 having a group II-VI compound semiconductor layer. On an n-type GaAs (100) substrate 701, a buffer layer 702 of n-type GaAs, a contact layer 703 of an $n^+$-type ZnSe, a cladding layer 704 of n-type $ZnS_{0.07}Se_{0.93}$, a light guiding layer 705 of n-type ZnSe are successively formed. On the light guiding layer 705, an active layer 706 of $Zn_{0.8}Cd_{0.2}Se$, a light guiding layer 707 of p-type ZnSe, a cladding layer 708 of a p-type $ZnS_{0.07}Se_{0.93}$, a contact layer 709 of $p^+$-type ZnSe are formed. On the contact layer 709, an insulating layer 710 made of polyimide is formed. The insulating layer 710 has a contact hole 712. On the insulating layer 710, an electrode 711 of Au is formed. The electrode 711 and the contact layer 709 forms an ohmic contact via the contact hole 712. To the n-type GaAs substrate 701, an electrode 700 of Zn is connected so as to form an ohmic contact. By a current flowing from the electrode 711, holes and electrons are recombined in the active layer 706, so that blue-green light having a wavelength of 490 nm (77K) is emitted (see M. A. Haase et al., *Appl. Phys. Lett.* 59 (1991) 1272).

In a light emitting device of semiconductor, a reduction of defects such as dislocation is one of critical problems to be solved. Such defects as dislocation may serve as a non-radiative center or a recombination center of a deep level during the recombination of holes and electrons, which results in a reduction of the light-emitting efficiency. In addition, a local heat generation is caused, which may result in a destruction of a light emitting device or the like.

Since it is difficult to obtain a group II-VI semiconductor substrate having a large area and a high quality, a group II-VI compound semiconductor single crystal thin film is usually grown on a group III-V semiconductor substrate. Such a hetero-epitaxial growth is likely to cause defects such as dislocation due to mismatches of lattice constants and thermal expansion coefficients between the group III-V semiconductor substrate and the group II-VI compound semiconductor single crystal thin film. Such dislocation may reach an uppermost layer of a semiconductor multi-layer formed on the II-V semiconductor substrate unless the dislocation is combined with another dislocation.

In the case where the group II-VI compound semiconductor single-crystal thin film is to be grown by MBE, group II elements and group VI elements arrive at the single-crystal substrate. Among these elements, the group VI elements arrive at the substrate as polyatomic molecules. In order to decompose the molecules, a high-temperature growth is preferred. However, since the group VI elements has a high vapor pressure, the revaporization of the group VI atoms occurs at an extremely high rate on the single crystal substrate. Therefore, it is difficult to grow a group II-VI compound semiconductor thin film at a high temperature, and a point defect may easily be introduced. Accordingly, the growth of the group II-VI compound semiconductor thin film is generally performed at low substrate temperatures of about 260° C. to 300° C.

As a result, the decomposition of the group VI molecules (e.g., $S_8 \rightarrow S_2$) and the incorporation of the group VI atoms generated by the decomposition into crystals do not smoothly advance, which results in a facet growth in an early growth stage. Therefore, a lot of defects such as dislocation, stacking defects are caused, and such structural defects may affect the overlying layer.

For the above reasons, in the group II-VI compound semiconductor thin film, it is difficult to fabricate a high-quality single-crystal thin film such as Si, GaAs, and an even super-thin film in an order of several atomic layers. As a result, a light emitting diode, a laser diode, or the like which utilizes such a group II-VI compound semiconductor thin film is of a low quality and lacks for stability. Specifically, it is impossible to obtain a laser which can stably and continuously oscillate at room temperature. It is only possible to obtain a laser which oscillates at low temperatures and has very short life time.

In order to obtain a group II-VI compound semiconductor with little dislocation, there generally exist two methods for reducing dislocation in a lattice mismatch system. In one method, the thickness of the layer is further reduced, and a strain is included in the thin film, so as to prevent the dislocation from occurring. In the other method, the dislocation which is once introduced is caused to escape in a direction perpendicular to the stacking direction, by using a strain superlattice.

As to the group II-VI compound semiconductor materials, in the conventional semiconductor laser device 720 shown in FIG. 16, the dislocation is prevented from occurring by making the thickness of the active layer 706 to be 100 angstroms or less. At the interface between ZnSe and $ZnS_xSe_{1-x}$ (x=0.07), it is preferred that each of the light guiding layers 705 and 707 has a thickness of 100 angstroms or less. However, the light guiding layer 705 or 707 of ZnSe should have a function of confining light therebetween, that requires large thickness of the light guiding layer 705 or 707. As a result, in the semiconductor laser device 720 shown in FIG. 16, the introduction of the misfit dislocation cannot be avoided at an interface between the light guiding layer 705 or 707 of ZnSe and the cladding layer 704 or 708 of $ZnS_xSe_{1-x}$ (x=0.07). Accordingly, a device destruction caused by defects occurs in the active layer 706, and the light guiding layers 705 and 707, which results in a short-term operation of the laser device at room temperature.

As described above, in order to obtain a group II-VI compound semiconductor thin film having a composition and a thickness suitable for effectively confining light in the prior art, the introduction of defects along with the lattice misfit is inevitable by material systems other than the MgZnSSe system which is a lattice match system. In addition, the thin film active layer having a strain exists at a position of a maximum light intensity distribution in the device structure, so that the active layer is easily deteriorated by light or heat generation. Accordingly, the device is significantly deteriorated during the high-temperature operation and the long-term operation.

SUMMARY OF THE INVENTION

The method for fabricating a semiconductor thin film of this invention, includes a step of epitaxially growing a semiconductor layer made of a group II-VI compound semiconductor to have a thickness of at least one atomic layer or more, on a main plane of a single-crystal semiconductor substrate, the semiconductor substrate having one of a diamond structure and a zinc blende structure, the main plane being inclined by an angle in the range of 2 to 16 degrees with respect to a (100) plane.

According to another aspect of the present invention, a light emitting device made of group II-VI compound semiconductors is provided. The light emitting device includes: a single-crystal semiconductor substrate having a main plane and having one of a diamond structure and a zinc blende structure, the main plane being inclined by an angle in the range of 2 to 16 degrees; and at least one or more semiconductor layers which is epitaxially grown on the semiconductor substrate, the semiconductor layers being made of group II-VI compound semiconductors.

According to still another aspect of the present invention a light emitting device made of group II-VI compound semiconductors is provided. The light emitting device includes: a semiconductor substrate; and a semiconductor layered structure including at least an active layer for recombining electrons with holes, the semiconductor layered structure having asymmetric constructions with respect to the active layer, thereby locating the maximum region of intensity distribution of light generated by the recombination outside the active layer.

According to still another aspect of the present invention, a light emitting device made of group I-VI compound semiconductors is provided. The light emitting device includes: a semiconductor substrate; and a semiconductor layered structure including an active layer for recombining electrons with holes, two light guiding layers formed to interpose the active layer, and two dislocation suppressing layers formed to interpose the two light guiding layers for suppressing dislocations.

According to the invention, a production method by which the introduction of lattice defects into a group II-VI compound semiconductor thin film is extremely reduced can be provided. In a resulting epitaxial layer of the group II-VI compound semiconductor thin film using this method, an even thin film with high crystallinity can be obtained.

Moreover, the film thickness can be controlled by a single atomic layer level. Accordingly, if the method is applied to the production of a semiconductor laser device or the like, the controllability of a thickness of an active layer is improved, and a high-output heterojunction laser which emits light with a narrow spectral width selected from blue to ultraviolet can be fabricated.

According to the invention, the introduction of misfit dislocations into an active layer and an optical guiding layer can be suppressed. This enables the resulting device to operate for a long time. In addition, it is possible for the device to operate at room temperature and it is possible to lower the laser oscillation threshold level.

Thus, the invention described herein makes possible the advantages of (1) providing a method of fabricating a single-crystal semiconductor thin film in which lattice defects which are introduced in an early growth stage can be reduced, and hence the interface is even, and (2) providing a method of fabricating a single-crystal semiconductor thin film in which an active layer having a strain is not subjected to a thermal burden, the diffusion of defects such as misfit dislocation is suppressed, and the propagation to a light guiding layer and an active layer is prevented.

These and other advantages of the present invention will become apparent to those skilled in the art upon reading and understanding the following detailed description with reference to the accompanying figures.

BRIEF DESCRIPTION OF THE DRAWINGS

FIG. 5 shows the relationship between a surface flatness and off angles.

FIG. 6A shows a pattern of reflection high-energy electron diffraction on a (511) plane according to Example 2 of the invention.

FIG. 6B shows a pattern of reflection high-energy electron diffraction on a (100) plane according to Example 2 of the invention.

DESCRIPTION OF THE PREFERRED EMBODIMENTS

Example 1

Figure 1:
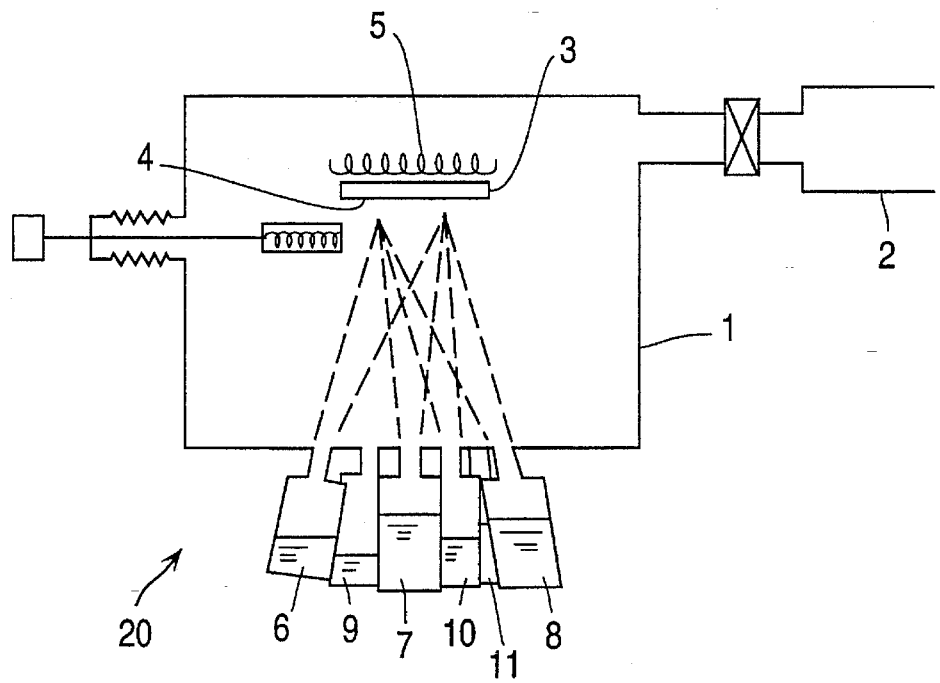
FIG. 1 is a schematic view showing an MBE apparatus for producing a single-crystal thin film which is used for the production of a semiconductor thin film according to the invention.

A method of fabricating a group II-VI compound semiconductor thin film and characteristics of the thin film in the first example according to the invention will be described with reference to FIGS. 1, and 2 to 5. The first example describes a method for producing an n-type ZnSe thin film on an n-type silicon doped GaAs substrate by heteroepitaxial growth. The production of the thin film according to this example is performed, for example, by an MBE single-crystal thin film producing apparatus 20 shown in FIG. 1.

The inside air of a stainless ultra-high vacuum chamber 1 is discharged so as to be $10^{-10}$ Torr by means of an ion pump 2. Seven GaAs substrates of (100) orientation are arranged on a surface 4 of a molybdenum substrate holder 3. The GaAs substrates have "off angles" of 0 degree (corresponding to a substrate of just (100) orientation), 2 degrees, 5 degrees, 7 degrees, 10 degrees, 15.8 degrees (corresponding to a substrate of (511) orientation), and 25.2 degrees (corresponding to a substrate of (311) orientation), respectively, in the <110> direction. The respective GaAs substrates are heated at 260° C. by a substrate heater 5. Molecular beams from a Zn molecular beam material 6 (the Zn beam intensity: $5 \times 10^{-7}$ Torr), an Se molecular beam material 8 (the Se beam intensity: $1 \times 10^{-6}$ Torr), and a Cl molecular beam material 10 (the $ZnCl_2$ beam intensity: $1 \times 10^{-10}$ Torr) are directed to the respective substrate. A Cl doped n-type ZnSe thin film is deposited by varying the growth time periods from 6 minutes to 4 hours (the film thickness: 0.1 to 4 μm).

Result 1

FIGS. 2 to 5 show the evaluation results of the ZnSe thin film obtained by the above method, for the crystallinity, a critical film thickness, and a slight inclination of the epilayer from the substrate, by using double crystal X-ray diffraction method.

Figure 2:
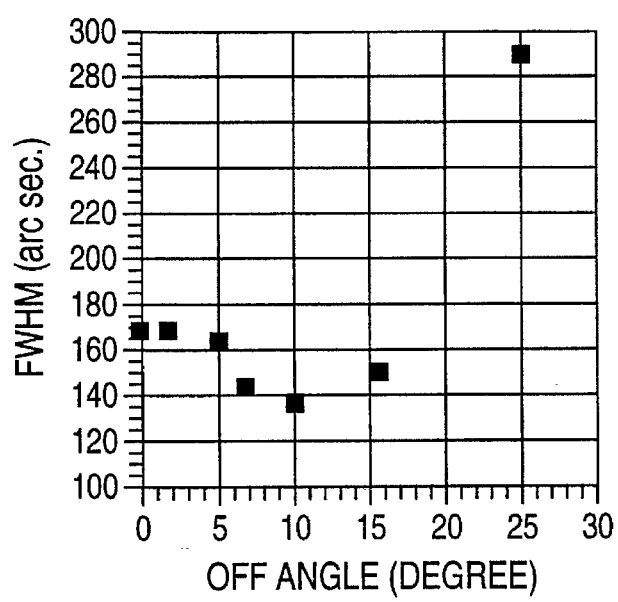
FIG. 2 shows the relationship between full-width at half maximum of the X-ray diffraction intensity curve and off angles of GaAs substrates.

FIG. 2 shows the relationship between a full-width at half maximum of the X-ray diffraction intensity curve (i.e., an aligned degree of atomic arrangement) as ordinate and off angles of the GaAs substrates as abscissa. As is seen from FIG. 2, the curve has a minimal value at degrees of 5 to 16, the crystallinity is extremely decreased at 25 degrees due to the generation of twin crystal or the like.

Figure 3:
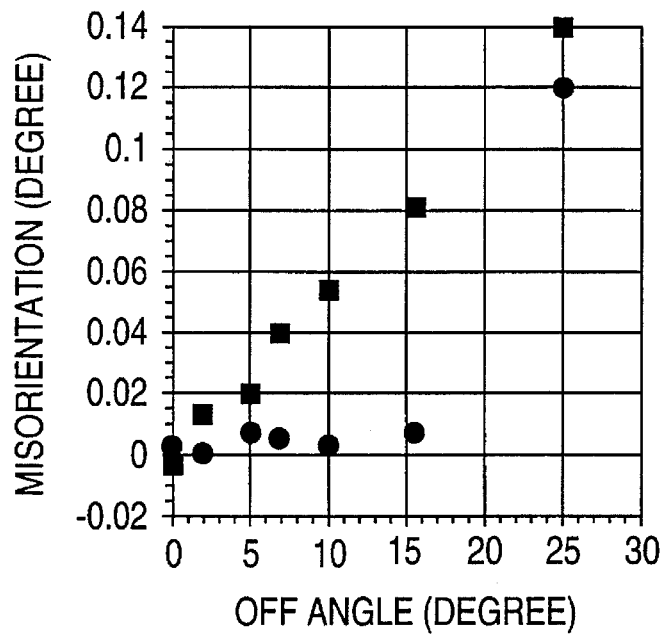
FIG. 3 shows the relationship between a misorientation and off angles.

FIG. 3 shows the relationship between a misorientation (an inclination of orientation of the epitaxial crystal from the orientation of the substrate crystal) as ordinate and off angles as abscissa. In FIG. 3, a solid square indicates an evaluation result with respect to the [011] direction which is the off-angle direction, and a solid circle indicates an evaluation result with respect to the [0-11] direction which is perpendicular to the off-angle direction. As is seen from FIG. 3, the misorientation (inclination at the interface) in the off-angle direction is increased in proportion to the increase in off angle of the substrate. In the direction perpendicular to the off-angle direction, the misorientation is not observed. It is seen that in the substrate having the off angle of 25°, the crystallinity of the ZnSe thin film is decreased, and that the misorientation occurs in the direction perpendicular to the off-angle direction. That is, the misorientation occurs in one direction at degrees of 2 to 16, and the misorientation occurs in both directions at 25°. The misorientation in one direction acts to reduce the strains by the mismatch at the interface, so as to suppress lattice defects. As a result, the crystallinity of the ZnSe thin film is improved.

Figure 4:
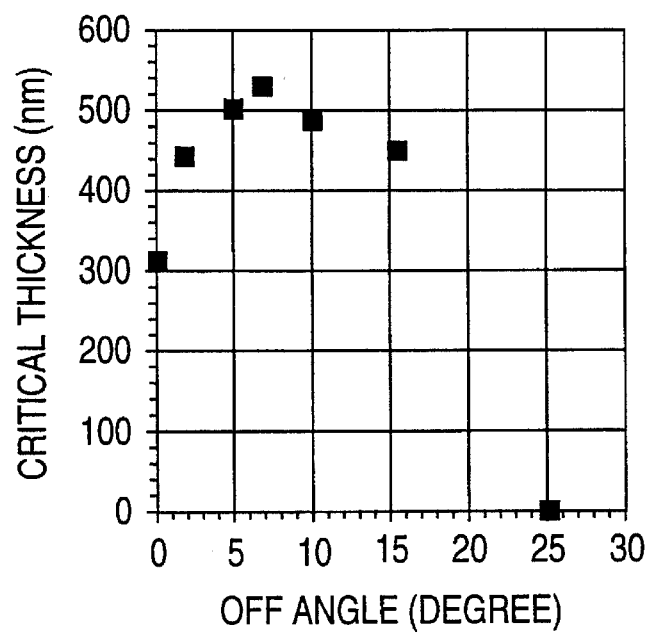
FIG. 4 shows the relationship between a critical thickness and off angles.

FIG. 4 shows the relationship between the critical thickness of the ZnSe thin film (a maximum value of the film thickness which does not introduce the lattice mismatch dislocation) as ordinate and the off angles as abscissa. The critical thickness varies depending on the off angle. In the range of 2° to 16°, the critical thickness takes a maximal value of 400 nm or more. Therefore, it is found that the critical thickness is about one and a half times as compared with the conventional epitaxial thin film using a single-crystal substrate of (100) orientation.

Moreover, it is found that, in the case where a ZnSe thin film having, for example, a thickness of 4 μm which is about ten times as large as the critical thickness is formed, the half-value width of the X-ray diffraction intensity curve becomes very small as compared with the conventional single-crystal substrate of (100) orientation. This means that the crystallinity of the ZnSe thin film having a thickness of 4 μm is remarkably improved as compared with the conventional method, so that the invention is also effective for the production of a ZnSe thin film having a critical thickness or a larger thickness.

FIG. 5 shows the relationship between a surface flatness of the epitaxial thin film as ordinate, and off angles as abscissa. It is found that, in the off-angle range of 2° to 16°, the flatness is apparently improved.

From the above-mentioned results, it is found that, in the GaAs single-crystal substrates of (100) orientation having 2° to 16° off angles, the ZnSe thin film epitaxially formed on the substrate can have superior crystallinity and flatness, and it is possible to have a larger critical thickness, as compared with the conventional single-crystal substrate of (100) orientation.

As a result, the variety of the design of the device structure can be widened. Even if the layer has a thickness which may cause a lattice mismatched dislocation beyond the critical thickness, the dislocation density is low as compared with the conventional (100) just plane orientation, and the dislocation can more easily be reduced as compared with the prior art by increasing the thickness of the layer, by inserting a superlattice, etc.

Example 2

A method of fabricating a group II-VI compound semiconductor thin film and characteristics of the thin film in the second example according to the invention will be described with reference to FIGS. 1, and 6A to 8B. The second example describes a method for forming an n-type ZnS thin film on an n-type iodine doped ZnS substrate by epitaxial growth.

The method for forming the ZnS thin film with an MBE single-crystal thin film producing apparatus 20 (shown in FIG. 1) is substantially the same as that in Example 1. The inside air of a stainless ultra-high vacuum chamber 1 is discharged so as to be $10^{-10}$ Torr by means of an ion pump 2. An n-type iodine doped ZnS substrate of (511) orientation which is prepared by an iodine transport method is located on the surface 4 of a molybdenum substrate holder 3. The ZnS substrate is heated at 260° C. by a substrate heater 5. Molecular beams from a Zn molecular beam material 6 (the Zn beam intensity: $5\times10^{-7}$ Torr), an S molecular beam material 7 (the S beam intensity: $1\times10^{-6}$ Torr), and a Cl molecular beam material 10 (the $ZnCl_2$ beam intensity: $1\times10^{-10}$ Torr) are directed to the substrate. A Cl doped n-type ZnS thin film is deposited to have a thickness of 5 μm (Cl concentration: $6\times10^{17}$ cm$^{-3}$).

As a comparative example, an n-type iodine doped ZnS substrate of (100) orientation which is different from the above substrate only in its orientation is located adjacently to the n-type iodine doped ZnS substrate of (511) orientation on the surface 4 of the substrate holder 5. Then, the above-described growth is performed simultaneously for both the substrates.

Result 2

The characteristic results of the thin films obtained by the above production will be described in detail with reference to FIGS. 6A to 8B. FIGS. 6A and 6B show patterns of the ZnS homo-epitaxial thin films grown by MBE at a growth temperature of 260° C. which are observed by reflection high-energy electron diffraction (RHEED) after 3 minutes from the growth start. FIG. 6A shows the pattern in the case where the thin film is formed on a (511) single-crystal substrate, i.e., on the n-type iodine doped ZnS substrate of (511) orientation. FIG. 6B shows the pattern in the case where the thin film is formed on a (100) single-crystal substrate, i.e., on the n-type iodine doped ZnS substrate of (100) orientation.

The RHEED pattern of FIG. 6B has inverted V-shapes in the single-crystal substrate of (100) orientation. The RHEED pattern of FIG. 6A has sharp streaked shapes in the case of the growth on the single-crystal substrate of (511) orientation. This indicates that in the early growth stage, the growth on the (100) substrate is facet growth and the growth on the (511) substrate is two-dimensional growth.

Figure 7A:
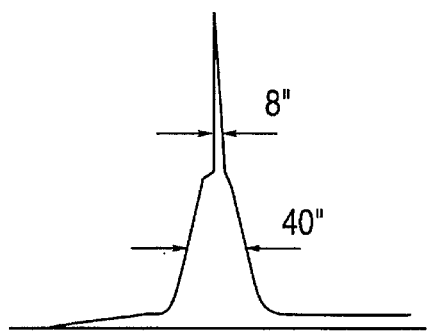
FIG. 7A shows diffraction intensity curve by double crystal X-ray diffraction method on the (511) plane according to Example 2 of the invention.
Figure 7B:
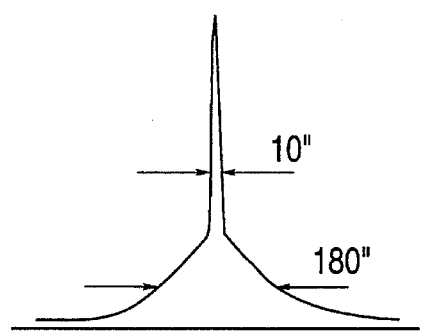
FIG. 7B shows diffraction intensity curve by double crystal X-ray diffraction method on the (100) plane according to Example 2 of the invention.

FIGS. 7A and 7B show diffraction intensity curves (rocking curves) of (511) reflection and (400) reflection by double crystal X-ray diffraction method. FIG. 7A shows a rocking curve in the case where the growth is conducted on the (511) substrate, i.e., in the case of the n-type iodine doped ZnS substrate of (511) orientation. FIG. 7B shows a rocking curve in the case where the growth is conducted on the (100) substrate, i.e., in the case of the n-type iodine doped ZnS substrate of (100) orientation.

In the growth on the (511) substrate as a first example in FIG. 7A, the half-value width of the ZnS thin film is remarkably decreased from 180 seconds to 40 seconds, as compared with the growth on the (100) substrate as a first comparative example. In other words, it is found that the thin film is grown on the (511) substrate by two-dimensional growth, and the resulting ZnS thin film has reduced disorder in atomic arrangement.

Figure 8A:
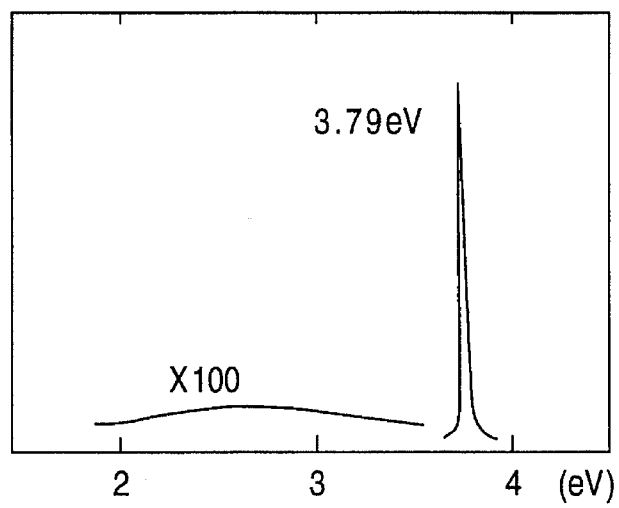
FIG. 8A shows photoluminescence emission spectrum according to Example 2 of the invention.
Figure 8B:
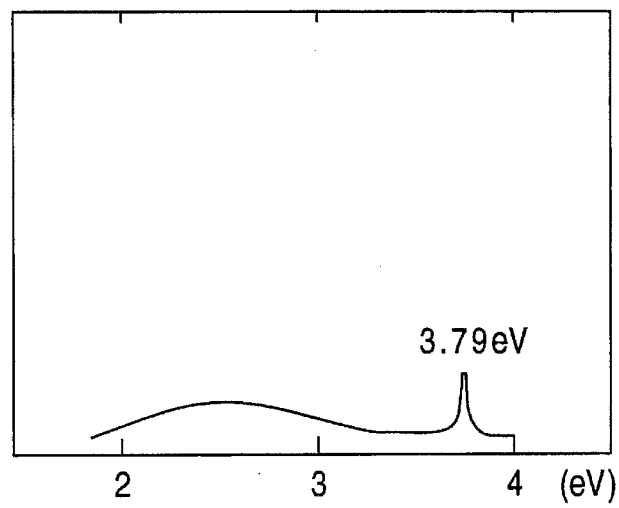
FIG. 8B shows photoluminescence emission spectrum according to Example 2 of the invention.

FIGS. 8A and 8B show photoluminescence emission spectra at 77K. FIG. 8A shows the spectrum in the growth on the (511) substrate, i.e., in the case of the n-type iodine doped ZnS single-crystal substrate of (511) orientation. FIG. 8B shows the spectrum in the growth on the (100) substrate, i.e., in the case of the n-type iodine doped ZnS single-crystal substrate of (100) orientation.

When the band edge emission intensities of ZnS usually appearing in the vicinity of 3.79 eV in FIGS. 8A and 8B are compared, the intensity in FIG. 8A is increased by two figures or more. This shows that the non-radiative recombination ratio in the ZnS thin film grown on the (511) substrate is remarkably reduced.

Furthermore, as the result of the observation with a transmission electron microscope (TEM), it is found that the defect density in the thin film on the (511) substrate is $5\times10^5$ cm$^{-2}$, which is reduced by two figures as compared with that in the thin film on the (100) substrate. It is also found that the interface between the substrate and the thin film is even at a one atomic layer level.

As described above, at temperatures of about 260° C. to 300° C., the group VI molecules which arrive at a (511) single-crystal substrate as polyatomic molecules are grown not by a facet growth but by a two-dimensional growth in several atomic layers after the growth start. Therefore, in the growth for succeeding layers, it is possible to extremely reduce the introduction of minute lattice defect into the fabricated thin film, whereby it is possible to obtain an even thin film which has a high crystallinity as an epitaxial layer.

Accordingly, it is found that an epitaxial thin film with a superior crystallinity and a steep interface can be formed on the (511) single-crystal substrate, as compared with the (100) single-crystal substrate.

Example 3

A method of fabricating a group II-VI compound semiconductor thin film and characteristics of the thin film in the third example according to the invention will be described with reference to FIGS. 1, and 9A to 11B. The third example describes a method for producing an n-type $ZnS_{0.07}Se_{0.93}$ thin film on an n-type silicon doped GaAs substrate by epitaxial growth.

The method for producing the thin film with an MBE single-crystal thin film producing apparatus 20 (shown in FIG. 1) is substantially the same as described in Example 1. The inside air of a stainless ultra-high vacuum chamber 1 is discharged so as to be $10^{-10}$ Torr by means of an ion pump 2. An n-type silicon doped GaAs single-crystal substrate of (511) orientation which is fabricated by an HB (Horizontal Bridgeman) method is located on the surface 4 of a molybdenum substrate holder 3. The substrate is heated at 300° C. by a substrate heater 5. Molecular beams from a Zn molecular beam material 6 (the Zn beam intensity: $5\times10^{-7}$ Torr), an S molecular beam material 7 (the S beam intensity: $1\times10^{-7}$ Torr), an Se molecular beam material 8 (the Se beam intensity: $6\times10^{-7}$ Torr), and a Cl molecular beam material 10 (the $ZnCl_2$ beam intensity: $1\times10^{-10}$ Torr) are respectively directed to the substrate. A Cl doped n-type $ZnS_{0.07}Se_{0.93}$ thin film is deposited to have a thickness of 5 μm (the Cl concentration: $6\times10^{17}$ cm$^{-3}$).

As a comparative example, an n-type silicon doped GaAs single-crystal substrate of (100) orientation which is different from the grown thin film only in the orientation of substrate is located adjacently to the n-type GaAs single-crystal GaAs substrate of (511) orientation on the surface 4 of the substrate holder 3. Then, the above-described growth is performed simultaneously for both the substrates.

Result 3

Figure 9A:
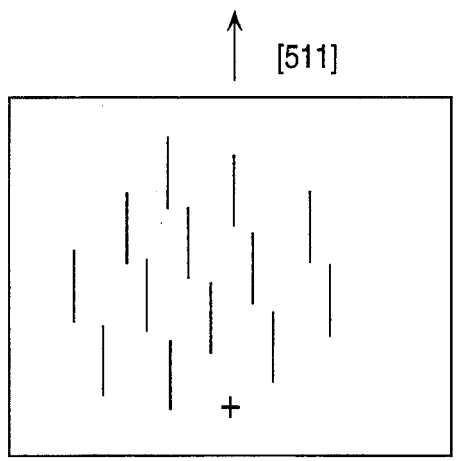
FIG. 9A shows a pattern of reflection high-energy electron diffraction on a (511) plane according to Example 3 of the invention.
Figure 9B:
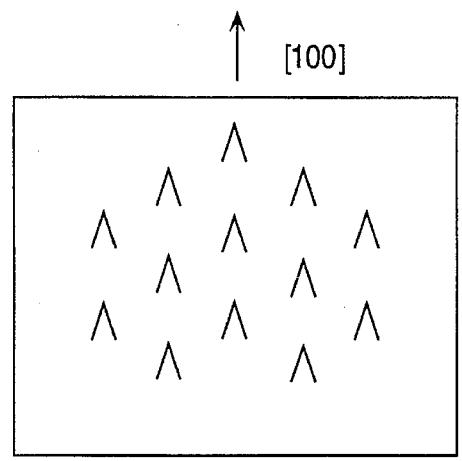
FIG. 9B shows a pattern of reflection high-energy electron diffraction on a (100) plane according to Example 3 of the invention.

The characteristic results of the thin films obtained by the above production will be described in detail with reference to FIGS. 9A to 11B. FIGS. 9A and 9B show patterns of the $ZnS_{0.07}Se_{0.93}$ hetero-epitaxial thin films grown by MBE at a growth temperature of 300° C. which are observed by reflection high-energy electron diffraction (RHEED) after 3 minutes from the growth start. FIG. 9A shows the pattern in the case where the thin film is formed on a (511) substrate, i.e., on the n-type silicon doped GaAs single-crystal substrate of (511) orientation. FIG. 9B shows the pattern in the case where the thin film is formed on a (100) substrate, i.e., on the n-type silicon doped GaAs single-crystal substrate of (100) orientation.

The RHEED pattern of FIG. 9B has inverted V-shapes in the single-crystal substrate of (100) orientation. The RHEED pattern of FIG. 9A has sharp streaked shapes in the case of the growth on the single-crystal substrate of (511) orientation. This indicates that in the early growth stage, the growth on the (100) substrate is facet growth and the growth on the (511) substrate is two-dimensional growth.

Figure 10A:
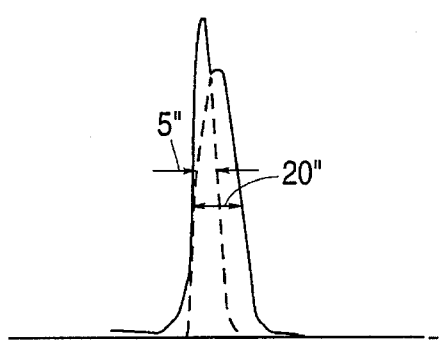
FIG. 10A shows diffraction intensity curve by double crystal X-ray diffraction method on the (511) plane according to Example 3 of the invention.
Figure 10B:
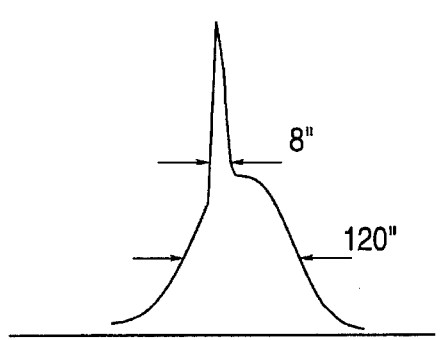
FIG. 10B shows diffraction intensity curve by double crystal X-ray diffraction method on the (100) plane according to Example 3 of the invention.

FIGS. 10A and 10B show diffraction intensity curves (rocking curves) of (511) reflection and (400) reflection by double crystal X-ray diffraction method. FIG. 10A shows a rocking curve in the case where the growth is conducted on the (511) substrate, i.e., in the case of the n-type silicon doped GaAs single-crystal substrate of (511) orientation. FIG. 10B shows a rocking curve in the case where the growth is conducted on the (100) substrate, i.e., in the case of the n-type silicon doped GaAs single-crystal substrate of (100) orientation.

In the growth on the (511) substrate as a first example in FIG. 10A, the half-value width of the $ZnS_{0.07}Se_{0.93}$ thin film is remarkably decreased from 120 seconds to 20 seconds, as compared with the growth on the (100) substrate as a first comparative example. In other words, it is found that the thin film is grown on the (511) substrate by coherent growth, and the resulting $ZnS_{0.07}Se_{0.93}$ thin film has reduced disorder in atomic arrangement.

Figure 11A:
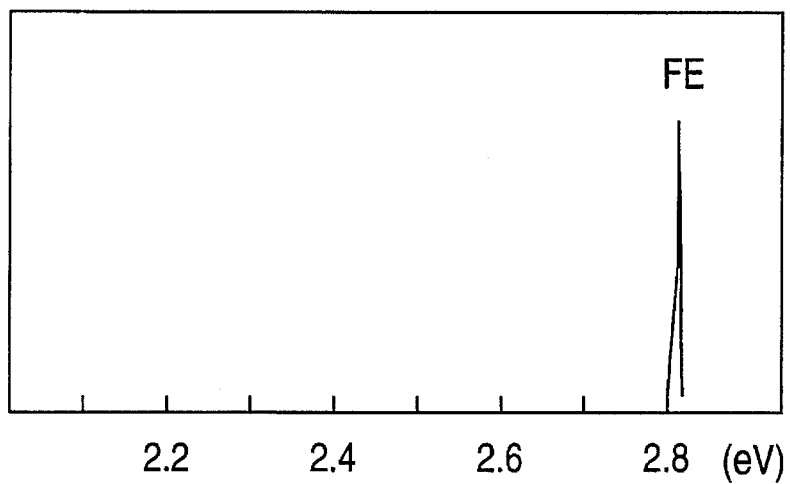
FIG. 11A shows photoluminescence emission spectrum according to Example 3 of the invention.
Figure 11B:
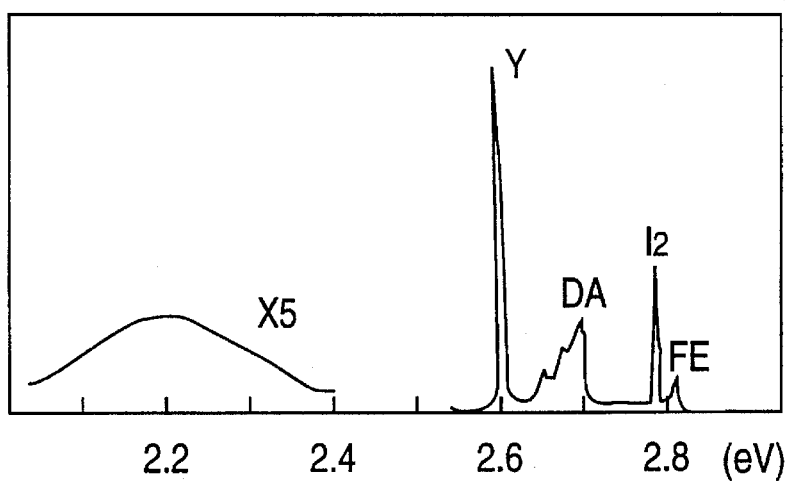
FIG. 11B shows photoluminescence emission spectrum according to Example 3 of the invention.

FIGS. 11A and 11B show photoluminescence emission spectra at 11K. FIG. 11A shows the spectrum in the growth on the (511) substrate, i.e., in the case of the n-type silicon doped GaAs single-crystal substrate of (511) orientation. FIG. 11B shows the spectrum in the growth on the (100) substrate, i.e., in the case of the n-type silicon doped GaAs single-crystal substrate of (100) orientation.

When the band edge emission intensities of $ZnS_{0.07}Se_{0.93}$ usually appearing in the vicinity of 2.81 eV in FIGS. 11A and 11b are compared, the intensity in FIG. 11A is increased by two figures or more. In addition, the emission spectrum of a type caused by a defect is also reduced. This shows that the non-radiative recombination center in the $ZnS_{0.07}Se_{0.93}$ thin film grown on the (511) substrate is more reduced.

Furthermore, as the result of the observation with TEM, it is found that the defect density in the thin film on the (511) substrate is $5\times10^4$ cm$^{-2}$, which is reduced by two figures as compared with that in the thin film on the (100) substrate. It is also found that the interface between the substrate and the thin film is even at a one atomic layer level.

From the above results, it is found that an epitaxial thin film with a superior crystallinity and a steep interface can be formed on the (511) single-crystal substrate, as compared with the (100) single-crystal substrate.

In the production for a device such as LED or LD, the introduction of defect can be reduced from the early growth stage in a semiconductor film which is directly in contact with a substrate, and also defects can be reduced in a light emitting layer (or an active layer) which is formed on the substrate via several semiconductor films. Moreover, a steep interface can be obtained, so that it is possible to produce a device in which the film thickness is controlled in a single atomic layer order.

The invention is not limited to single crystal thin films of ZnS and ZnSSe in the above examples. Additionally, the present invention is effective in a thin film of group II-VI compound semiconductor, which has a diamond structure or a zinc blende structure, such as ZnSe, ZnCdSe, ZnCdS, or ZnCdSSe, and effective for the growth on a substrate of a material such as ZnSe, ZnSSe, Si, or GaP. Moreover, the present invention is not limited to the cases where the GaAs single-crystal substrate and the ZnS single-crystal substrate in the above examples. Additionally, the present invention is effective in the case of using a substrate of a material such as ZnSe, CdS or CdSe single crystal or an alloy crystal thereof.

Example 4

Figure 12:
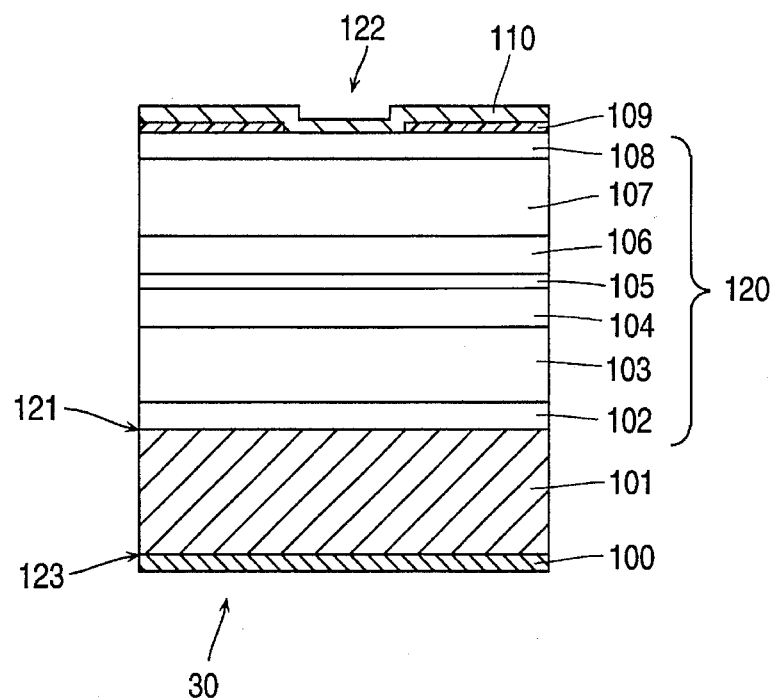
FIG. 12 is a cross-sectional view showing a construction of a group II-VI compound semiconductor laser device using a substrate with an off angle according to Example 4 of the invention.

A group II-VI compound semiconductor device in the fourth example according to the invention will be described with reference to FIG. 12.

Example 4 describes a double-hetero semiconductor laser device to which the method for producing a group II-VI compound semiconductor thin film according to Example 1 is applied. FIG. 12 schematically shows a cross section of a laser device 30 according to the invention. The laser device 30 includes a semiconductor substrate 101 and a semiconductor layered structure 120 formed thereon. The semiconductor substrate 101 is an n-type GaAs substrate having a main plane 121 with an off angle of 5 degrees from a (100) plane.

The semiconductor layered structure 120 includes a contact layer 102 (thickness: 0.1 μm) formed on the semiconductor substrate 101, a cladding layer 103 (thickness: 4 μm) formed on the contact layer 102, and a light guiding layer 104 (thickness: 0.5 μm) formed on the cladding layer 103. The contact layer 102, the cladding layer 103, and the light guiding layer 104 are formed of $n^+$-type $ZnS_{0.07}Se_{0.93}$, n-type $ZnS_{0.07}Se_{0.93}$, and n-type ZnSe, respectively, and they are doped with chlorine of $5\times10^{18}$ cm$^{-3}$, $1\times10^{18}$ cm$^{-3}$, and $1\times10^{17}$ cm$^{-3}$, respectively. The semiconductor layered structure 120 further includes an active layer 105 (thickness: 10 nm) on the light guiding layer 104. The active layer 105 is formed of undoped $Zn_xCd_{1-x}Se$ (x=0.8). The semiconductor layered structure 120 further includes a light guiding layer 106 (thickness: 0.5 μm) formed on the active layer 105, a cladding layer 107 (thickness: 1.5 μm) formed on the light guiding layer 106, and a contact layer 108 (thickness: 0.5 μm) formed on the cladding layer 107. The light guiding layer 106, the cladding layer 107, and the contact layer 108 are made of p-type ZnSe, p-type $ZnS_{0.07}Se_{0.93}$, and $p^+$-type ZnSe, respectively, and they are doped with nitrogen of $1\times10^{17}$ cm$^{-3}$, $1\times10^{18}$ cm$^{-3}$, and $5\times10^{18}$ cm$^{-3}$, respectively.

An insulating film 109 of polyimide is formed on the contact layer 108. An electrode 110 of Au is formed on the insulating film 109. The electrode 110 is electrically connected to the contact layer 108 so as to form an ohmic contact via a contact hole 122. On the other surface 123 of the semiconductor substrate 101 on which the above layers are not formed, an electrode 100 of indium is formed. The electrode 100 is electrically connected to the semiconductor substrate 101 so as to form an ohmic contact.

A method for producing the laser device 30 using a molecular beam epitaxial (MBE) growing apparatus shown in FIG. 1 will be specifically described. A semiconductor substrate 101 of n-type GaAs which is doped with Si of $4\times10^{18}$ cm$^{-3}$ is located on a molybdenum semiconductor holder 3, and heated at 250° C. by a substrate heater 5. Molecular beams are directed to the semiconductor substrate 101 from a Zn molecular beam material 6, an S molecular beam material 7, an Se molecular beam material 8, a Cd molecular beam material 9, a Cl dopant material 10, and an N dopant material 11, respectively, so that each layer is deposited.

More specifically, first, a contact layer 102 of $n^+$-type $ZnS_{0.07}Se_{0.93}$ is grown for 6 minutes, under conditions of the Zn molecular beam intensity of $5\times10^{-7}$ Torr, the S molecular beam intensity of $2\times10^{-7}$ Torr, the Se molecular beam intensity of $1\times10^{-6}$ Torr, and the n-type impurity Cl molecular beam intensity of $1\times10^{-10}$ Torr.

Next, only the Cl molecular beam intensity is reduced to $3\times10^{-11}$ Torr, so that a cladding layer 103 of n-type $ZnS_{0.07}Se_{0.93}$ is grown for four hours. Then, a light guiding layer 104 of n-type ZnSe is grown for six minutes under conditions that the Cl molecular beam intensity is $1\times10^{-11}$ Torr, and that only the S molecular beam is closed with a shutter mechanism. Following this, after the light guiding layer 104 of n-type ZnSe is grown for 1 hour, an active layer 105 of ZnCdSe is grown for 30 minutes under conditions of the Zn molecular beam intensity of $4\times10^{-7}$ Torr, the Cd molecular beam intensity of $1\times10^{-7}$ Torr, and the Se molecular beam intensity of $1\times10^{-6}$ Torr. Thereafter, a light guiding layer 106 of p-type ZnSe is grown under conditions that the intensity of an $N_2$ radical beam which is doped as a p-type impurity is set to be $4\times10^{-10}$ Torr, and that the conditions for Zn and Se are not changed. Then, the S molecular beam shutter is opened, and the intensity of $N_2$ radical beam is set to be $4\times10^{-9}$ Torr, and a cladding layer 107 of p-type $ZnS_{0.07}Se_{0.93}$ is grown for 1.5 hours. Finally, a contact layer 108 of $p^+$-type ZnSe is grown under conditions that the S molecular beam shutter is closed and the intensity of $N_2$ radical beam is set to be $1\times10^{-8}$ Torr. In this way, an epitaxial wafer is obtained.

Thereafter, an insulating film 109 of polyimide is formed on the contact layer 108 of $p^+$-type ZnSe in the resulting epitaxial wafer. Then, a resist pattern (not shown) having a stripe shape with a width of 20 μm is formed by a photolithography technique, so that a contact hole 122 having a width of 20 μm is formed in the center portion of the device. Next, an electrode 110 of Au is formed on the cladding layer 108 and the insulating film 109 by resistive heating evaporation, an electron beam deposition, or another method. Then, the resulting wafer is cleaved so as to obtain a laser pellet (not shown) having a size of 200 μm (resonator length)×300 μm (width)×250 μm (thickness).

On the both facets of the resonator, $Al_2O_3$ or ZnS is deposited, so as to form a protective reflection film. The laser pellet is fixed to a Cu (heat sink) stem by melting metal in such a manner that the side of the stripe electrode is in contact with the stem. On the cathode side, In bonding is performed. Thus, a final laser device 30 is obtained.

A composition of $ZnS_xSe_{1-x}$ where x is about 0.07 has a lattice match with a GaAs substrate, but has a lattice mismatch of 0.26% with ZnSe. Misfit dislocations caused by a lattice mismatch occur at the interfaces (between the layers 103 and 104, and between the layers 106 and 107). In this invention, a semiconductor layered structure 120 is formed on the semiconductor substrate 101 having the main plane 121 which has an off angle of 5 degrees from a (100) plane. As is described in Examples 1 to 3, on a substrate having an off angle in the range of 2 to 16 degrees from the (100) plane, semiconductor layers having a lattice match and having a lattice mismatch can be epitaxially grown with reduced dislocations. Therefore, all the layers 102 to 108 in the semiconductor layered structure 120 formed on the semiconductor substrate 101 have reduced dislocations.

The material ZnCdSe of the active layer has a much larger lattice mismatch with ZnSe. However, by forming the active layer of ZnCdSe on the above-mentioned substrate, the active layer can exist without causing dislocations while including strains up to 18 nm which is about one and a half times as large as that in the prior art.

Therefore, electrons injected into the active layer 105 is recombined with holes, and most of the emitted light is guided through the light guiding layers 104 and 106 of ZnSe, so as to perform a laser oscillation.

The laser device 30 produced by the above method has a peak oscillation wavelength of 490 nm at 77K, and the oscillation threshold level is 10 mA at 77K in the CW operation. The voltage applied to the whole device is 4 V. By using the laser device 30, the time-sequence change of the light output during the driving at 77K and 50 mA was observed. As a result, it was found that the attenuation of the emission intensity can be suppressed as compared with the conventional structure, and a laser oscillation without change in the emission intensity for a longer time period by two figures.

Example 5

Figure 13:
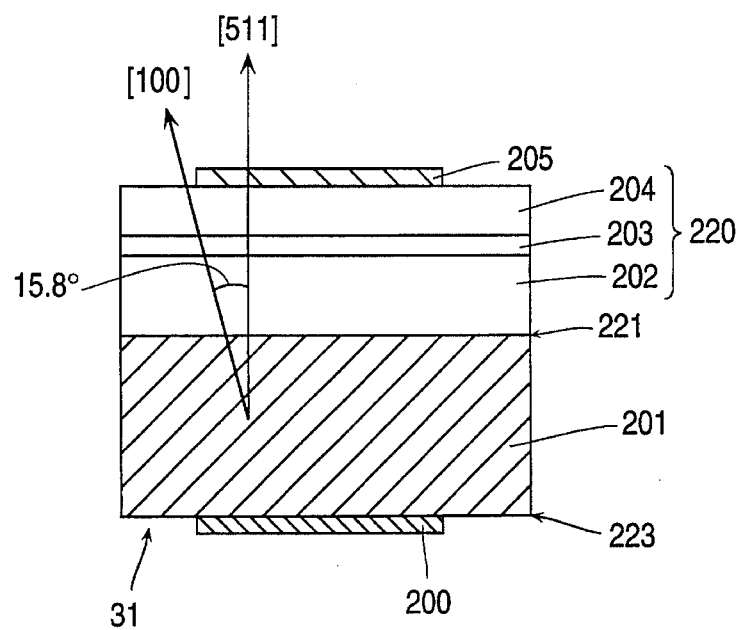
FIG. 13 is a cross-sectional view showing a construction of a light emitting diode of pn junction type of a group II-VI compound semiconductor according to Example 5 of the invention.

A group II-VI compound semiconductor device in the fifth example according to the invention will be described with reference to FIG. 13.

Example 5 describes a light emitting diode to which the method for producing a group II-VI compound semiconductor thin film according to Example 2 is applied. FIG. 13 schematically shows a cross section of a light emitting device 31 according to the invention. The light emitting device 31 includes a semiconductor substrate 201 and a semiconductor layered structure 220 formed thereon. The semiconductor substrate 201 is an n-type iodine doped ZnS substrate having a main plane 221 of (511) orientation. The (511) plane forms an angle of 15.8 degrees with respect to the (100) plane.

The semiconductor layered structure 220 includes an injection layer 202 (thickness: 5 μm) formed on the semiconductor substrate 201, a light emitting layer 203 (thickness: 2 μm) formed on the injection layer 202, and an injection layer 204 (thickness: 3 μm) formed on the light emitting layer 203. The injection layer 202 and the light emitting layer 203 are formed of $n^+$-type ZnS, and n-type ZnS, respectively, and they are doped with chlorine of $6 \times 10^{18}$ cm$^{-3}$ and $5 \times 10^{17}$ cm$^{-3}$, respectively. The injection layer 204 is formed of p-type ZnS and doped with phosphorus of $5 \times 10^{18}$ cm$^{-3}$.

An electrode 205 of Au is formed on the injection layer 204. The electrode 205 is electrically connected to the injection layer 204 so as to form an ohmic contact. On the other surface 223 of the semiconductor substrate 201 on which the above layers are not formed, an electrode 200 of aluminum is formed. The electrode 200 is electrically connected to the semiconductor substrate 201 so as to form an ohmic contact.

The method for fabricating the light emitting diode in Example 5 is substantially the same as described in Example 2. The inside air of a stainless ultra-high vacuum chamber 1 as shown in FIG. 1 is discharged so as to be $10^{-10}$ Torr by means of an ion pump 2. An n-type iodine doped ZnS single-crystal substrate of (511) orientation which is fabricated by an iodine transport method is located on the surface 4 of a molybdenum substrate holder 3. The substrate is heated at 260° C. by a substrate heater 5. Molecular beams from a Zn molecular beam material 6, an S molecular beam material 7, and a Cl molecular beam material 10 are respectively directed to the substrate. Thus, an injection layer 202 of n-type ZnS and a light emitting layer 203 of n-type ZnS are deposited. Thereafter, the Cl molecular beam material 10 is closed and a P molecular beam material 9 is opened by an shutter operation, so that an injection layer 204 of p-type ZnS is formed. The p-type electrode 205 and the n-type electrode 200 are formed by resistive heating evaporation and electron beam deposition, respectively.

The thus fabricated light emitting diode 31 of pn-junction type exhibits the Schottky characteristic at a lower voltage in the forward rising voltage as compared with a device which is fabricated using a ZnS (100) single-crystal substrate. Moreover, ultraviolet rays having a peak of 340 nm at voltages of 3 mA or more can be emitted.

Example 6

Figure 14:
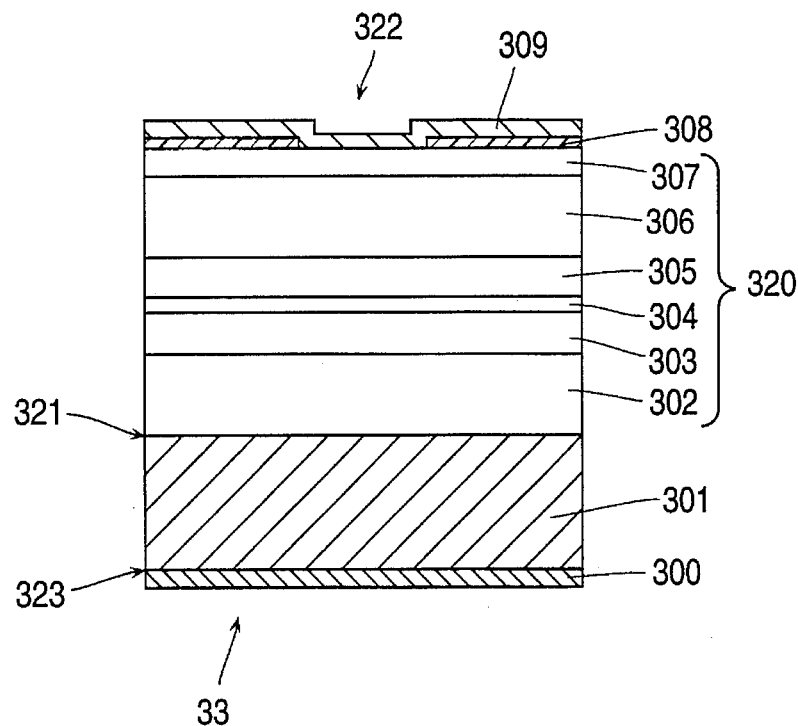
FIG. 14 is a cross-sectional view showing a construction of a group II-VI compound semiconductor laser device using a substrate of (511) orientation according to Example 6 of the invention.

A group II-VI compound semiconductor device in the sixth example according to the invention will be described with reference to FIG. 14.

Example 6 describes a double-hetero semiconductor laser device to which the method for producing a group II-VI compound semiconductor thin film according to Example 2 is applied. FIG. 14 schematically shows a cross section of a laser device 33 according to the invention. The laser device 33 includes a semiconductor substrate 301 and a semiconductor layered structure 320 formed thereon. The semiconductor substrate 301 is an n-type silicon doped GaAs substrate having a main plane 321 of (511) orientation. The (511) plane forms an angle of 15.8 degrees with respect to the (100) plane.

The semiconductor layered structure 320 includes a cladding layer 302 (thickness: 4 μm) formed on the semiconductor substrate 301, and a light guiding layer 303 (thickness: 0.5 μm) formed on the cladding layer 302. The cladding layer 302 and the light guiding layer 303 are formed of n-type $ZnS_{0.06}Se_{0.94}$ and n-type ZnSe, respectively, and they are doped with chlorine of $1 \times 10^{18}$ cm$^{-3}$ and $1 \times 10^{17}$ cm$^{-3}$, respectively. The semiconductor layered structure 320 further includes an active layer 304 (thickness: 10 nm) on the light guiding layer 303. The active layer 304 is formed of undoped $Zn_xCd_{1-x}Se$ (x=0.8). The semiconductor layered structure 320 further includes a light guiding layer 305 (thickness: 0.5 μm) formed on the active layer 304, a cladding layer 306 (thickness: 1.5 μm) formed on the light guiding layer 305, and a contact layer 307 (thickness: 0.5 μm) formed on the cladding layer 306. The light guiding layer 305, the cladding layer 306, and the contact layer 307 are made of p-type ZnSe, p-type $ZnS_{0.06}Se_{0.94}$, and $p^+$-type ZnSe, respectively, and they are doped with nitrogen of $1 \times 10^{17}$ cm$^{-3}$, $1 \times 10^{18}$ cm$^{-3}$, and $5 \times 10^{18}$ cm$^{-3}$, respectively.

An insulating film 308 of polyimide is formed on the contact layer 307. An electrode 309 of Au is formed on the insulating film 308. The electrode 309 is electrically connected to the contact layer 307 so as to form an ohmic contact via a contact hole 322. On the other surface 323 of the semiconductor substrate 301 on which the above layers are not formed, an electrode 300 of indium is formed. The electrode 300 is electrically connected to the semiconductor substrate 301 so as to form an ohmic contact.

The laser device 33 is fabricated by the same method as in Example 4. A semiconductor layered structure 320 is formed on the (511) main plane 321 of the semiconductor substrate 301 of n-type GaAs by using an MBE apparatus. On the cladding layer 307, an insulating film 308 of polyimide is formed. Then, a resist pattern (not shown) having a stripe shape with a width of 20 μm is formed by a photolithography technique, so that a contact hole 322 having a width of 20 μm is formed in the center portion of the device in such a manner that the contact hole 322 extends along the [0-11] direction of the semiconductor substrate 301. Next, an electrode 309 of Au is formed on the cladding layer 307 and the insulating film 308. An electrode 300 of In is formed on the other surface 323 of the semiconductor substrate 301. Then, the resulting wafer is cleaved so as to obtain a semiconductor laser device having a size of 250 μm×300 μm.

The double-hetero semiconductor laser device 33 produced by the above method has a peak oscillation wavelength of 500 to 530 nm (in the case of x=0.8), and exhibits high output and good aging characteristics.

Example 7

A group II-VI compound semiconductor device in the seventh example according to the invention will be described with reference to FIG. 15A.

Figure 15A:
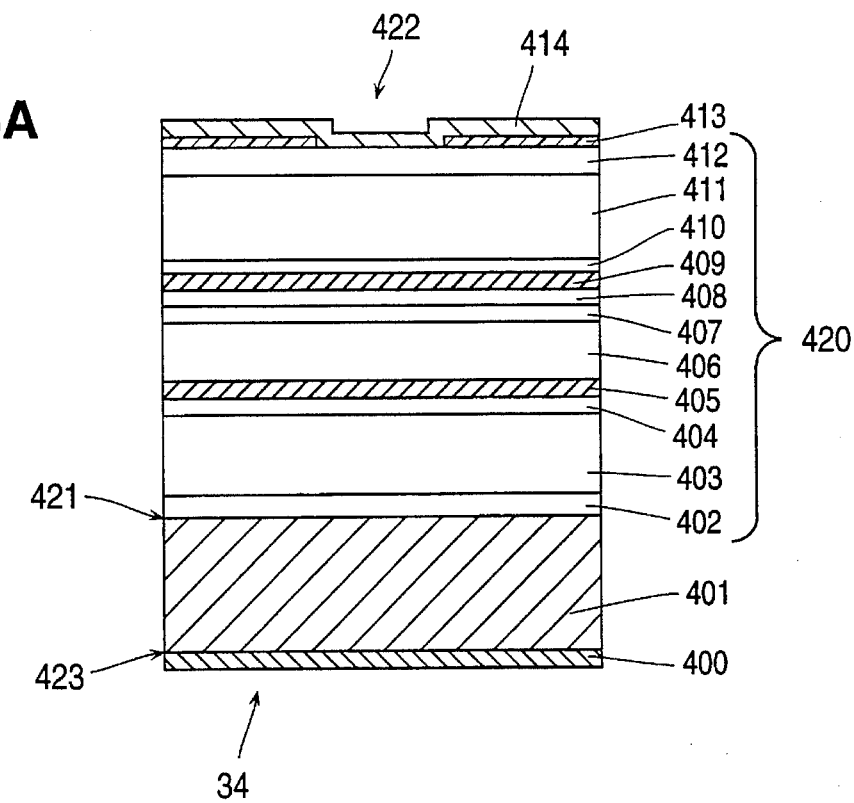
FIG. 15A is a cross-sectional view showing a construction of a group II-VI compound semiconductor laser device using a strained-layer superlattice according to Example 7 of the invention.

FIG. 15A schematically shows a cross section of a laser device 34 according to the invention. The laser device 34 includes a semiconductor substrate 401 and a semiconductor layered structure 420 formed thereon. The semiconductor substrate 401 is an n-type GaAs substrate having a main plane 421 of just (100) orientation.

The semiconductor layered structure 420 includes a contact layer 402 (thickness: 0.1 μm) formed on the semiconductor substrate 401, a cladding layer 403 (thickness: 4 μm) formed on the contact layer 402, and a semiconductor layer 404 (thickness: 0.1 μm) formed on the cladding layer 403. The contact layer 402, the cladding layer 403, and the semiconductor layer 404 are formed of $n^+$-type $ZnS_{0.07}Se_{0.93}$, n-type $ZnS_{0.07}Se_{0.93}$, and n-type ZnSe, respectively, and they are doped with chlorine of $5\times10^{18}$ $cm^{-3}$, $1\times10^{18}$ $cm^{-3}$, and $1\times10^{17}$ $cm^{-3}$, respectively.

The semiconductor layered structure 420 further includes a superlattice layer 405 on the semiconductor layer 404 as a dislocation suppressing layer. The superlattice layer 405 has a layered structure in which ten n-type ZnSe layers and ten n-type $ZnS_{0.07}Se_{0.93}$ layers are alternately disposed. Each of the layers in the layered structure of the superlattice layer 405 has a thickness of 0.1 μm. The n-type ZnSe layer and the n-type $ZnS_{0.07}Se_{0.93}$ layer are doped with chlorine of $1\times10^{18}$ $cm^{-3}$, and $1\times10^{18}$ $cm^{-3}$, respectively.

The semiconductor layered structure 420 further includes a light guiding layer 406 (thickness: 1 μm) formed on the superlattice layer 405, an active layer 407 (thickness: 10 nm) formed on the light guiding layer 406, and a light guiding layer 408 (thickness: 0.1 μm) formed on the active layer 407. The light guiding layers 406 and 408 are made of n-type ZnSe, and p-type ZnSe, respectively, and they are doped with chlorine of $1\times10^{17}$ $cm^{-3}$, and with nitrogen of $1\times10^{17}$ $cm^{-3}$, respectively. The active layer 407 is made of non-doped $Zn_{0.8}Cd_{0.2}Se$.

The semiconductor layered structure 420 further includes a superlattice layer 409 on the light guiding layer 408 as a dislocation suppressing layer. The superlattice layer 409 has a layered structure in which ten p-type ZnSe layers and ten p-type $ZnS_{0.07}Se_{0.93}$ layers are alternately disposed. Each of the layers in the layered structure of the superlattice layer 409 has a thickness of 0.1 μm. The p-type ZnSe layer and the p-type $ZnS_{0.07}Se_{0.93}$ layer are doped with nitrogen of $1\times10^{18}$ $cm^{-3}$ and $1\times10^{18}$ $cm^{-3}$, respectively.

The semiconductor layered structure 420 further includes a semiconductor layer 410 (thickness: 0.1 μm) formed on the superlattice layer 409, a cladding layer 411 (thickness: 1.5 μm) formed on the semiconductor layer 410, and a contact layer 412 (thickness: 0.1 μm) formed on the cladding layer 411. The semiconductor layer 410, the cladding layer 411, and the contact layer 412 are made of p-type ZnSe, p-type $ZnS_{0.07}Se_{0.93}$, and p-type ZnSe, respectively, and they are doped with nitrogen of $1\times10^{17}$ $cm^{-3}$, $1\times10^{18}$ $cm^{-3}$, and $5\times10^{18}$ $cm^{-3}$, respectively.

An insulating film 413 of polyimide is formed on the contact layer 412. An electrode 414 of Au is formed on the insulating film 413. The electrode 414 is electrically connected to the contact layer 412 so as to form an ohmic contact via a contact hole 422. On the other surface 423 of the semiconductor substrate 401 on which the above layers are not formed, an electrode 400 of indium is formed. The electrode 400 is electrically connected to the semiconductor substrate 401 so as to form an ohmic contact.

The contact layer 402 has a lattice match with the semiconductor substrate 401 of GaAs having the main plane 421 of (100) orientation. The cladding layer 403 and the semiconductor layer 410 have lattice mismatches of 0.26% with the semiconductor layer 404 and the cladding layer 411, respectively. Specifically, $ZnS_{0.07}Se_{0.93}$ has a lattice mismatch of 0.26% with ZnSe. Accordingly, misfit dislocations caused by such lattice mismatches occur at the interface between the cladding layer 403 and the semiconductor layer 404 and at the interface between the semiconductor layer 410 and the cladding layer 411. In this invention, the superlattice layers 405 and 409 are formed so that the misfit dislocations occurring at the interfaces do not affect the overlying layers. The superlattice layers 405 and 409 each have a layered structure of a plurality of thin semiconductor layers. By utilizing the strain feature of the respective thin semiconductor layers, the superlattice layers 405 and 409 can absorb the lattice mismatches. As a result, the light guiding layer 406 having fewer defects such as dislocations can be formed on the superlattice layer 405 without being affected by the misfit dislocations caused at the interface between the cladding layer 403 and the semiconductor layer 404. By providing the superlattice layers 405 and 409 between the semiconductor layers 404 and 410, and by providing the active layer 407 between the superlattice layers 405 and 409, the occurrence of defects such as misfit dislocations can be reduced in the active layer 407.

In the laser device 34, electrons and holes are confined in the active layer 407. Specifically, the cladding layer 411 of p-type ZnSSe and the semiconductor layer 410 of p-type ZnSe inject holes into the active layer 407 of $Zn_{0.8}Cd_{0.2}Se$, and the cladding layer 403 of n-type ZnSSe and the semiconductor layer 404 of n-type ZnSe inject electrons into the active layer 407.

The active layer 407 of $Zn_{0.8}Cd_{0.2}Se$ has large lattice mismatches with the light guiding layers 406 and 408 of ZnSe. However, the thickness of the active layer 407 is set to be 10 nm or less, so that the lattice mismatches can exist while including strains but not causing defects such as dislocations. When the electrons and holes are combined in the active layer 407, laser light is emitted. Since the active layer 407 is thin, most of the emitted light permeates into the light guiding layers 406 and 408 which interposes the active layer 407. The permeating light is confined in the semiconductor layers 404 to 410 between the cladding layer 403 and 411. In the semiconductor layered structure 420 of the laser device 34, the construction of the semiconductor layers 408 to 412 over the active layer 407 and the construction of the semiconductor layers 406 to 401 under the active layer 407 are asymmetric with respect to the active layer 407. Specifically, the thickness of the light guiding layer 408 is 0.1 μm, while the thickness of the light guiding layer 406 is 1 μm. Therefore, the center of the intensity distribution of the emitted light exists in the light guiding layer 406. This means that the layer in which the holes and the electrons are recombined is different from the layer which is the center of light emission. As a result, the active layer 407 which is thermally unstable is prevented from causing to be a high temperature. Therefore, the laser device 34 can stably emit laser light for a long time. In this example, it is designed such that the light emission center exists in the light guiding layer 406 of n-type conductivity. It is understood that the light emission center may exist in the light guiding layer 408 of p-type conductivity.

The group II-VI compound semiconductors have a lower thermal conductivity than those of group IV semiconductors such as Si or Ge and group III-V compound semiconductors such as GaAs. Moreover, the production processes such as deposition for the group II-VI compound semiconductors are performed at a lower temperature. For such reasons, a laser device produced by a conventional method is thermally unstable. Such a laser device may cause a point defect by its light emission, which is known as a self-compensation effect. Therefore, the resulting device is likely to be deteriorated if an unstable active layer including strains exists in a maximum region of the light intensity distribution.

According to the invention, the maximum region of the light intensity distribution is separated from the active layer in which holes and electrons are recombined, and defects caused by misfit dislocations are prevented from occurring in the vicinity of the active layer. Therefore, the device deterioration due to heat can be suppressed.

A method for producing the laser device 34 will be described. The laser device 34 is fabricated on an Si doped n-type GaAs substrate (Si concentration: $4\times10^{18}$ cm$^{-3}$), for example, using a molecular beam epitaxial (MBE) growing apparatus. First, a contact layer 402 of n$^+$-type ZnS$_{0.07}$Se$_{0.93}$ is grown for 6 minutes at a substrate temperature of 250° C., under conditions of the Zn molecular beam intensity of $5\times10^{-7}$ Torr, the S molecular beam intensity of $2\times10^{-7}$ Torr, the Se molecular beam intensity of $1\times10^{-6}$ Torr, and the n-type impurity Cl molecular beam intensity of $1\times10^{-10}$ Torr.

Next, only the Cl molecular beam intensity is reduced to $3\times10^{-11}$ Torr, so that a cladding layer 403 of n-type ZnS$_{0.07}$Se$_{0.93}$ is grown for four hours. Then, a semiconductor layer 404 of n-type ZnSe is grown for six minutes under conditions that the Cl molecular beam intensity is $1\times10^{-11}$ Torr, and that only the S molecular beam is closed with a shutter mechanism.

The growth of the superlattice layer 405 is performed using another K-cell with a lower growth speed by 1 figure. The Zn molecular beam intensity, the Se molecular beam intensity, the S molecular beam intensity, and the Cl beam intensity are set to be $5\times10^{-8}$ Torr, $1\times10^{-7}$ Torr, $2\times10^{-8}$ Torr, and $1\times10^{-11}$ Torr, respectively. A series of steps of ZnS$_{0.07}$Se$_{0.93}$ for 1 minute, irradiation interruption for 1 minutes, ZnSe for 4 minutes, and interruption for 1 minute is repeated ten times, so as to fabricate the superlattice layer 405.

Following this, after a light guiding layer 406 of n-type ZnSe is grown for 1 hour under the same conditions for the semiconductor layer 404, an active layer 407 of Zn$_{0.8}$Cd$_{0.2}$Se is grown for 5 minutes under conditions of the Zn molecular beam intensity of $4\times10^{-7}$ Torr, the Cd molecular beam intensity of $1\times10^{-7}$ Torr, and the Se molecular beam intensity of $1\times10^{-6}$ Torr.

Thereafter, the intensity of an N$_2$ radical beam which is doped as a p-type impurity is set to be $4\times10^{-10}$ Torr. A light guiding layer 408 of p-type ZnSe is grown under the same conditions for Zn and Se as those for the light guiding layer 406. Then, a p-type superlattice layer 409 is formed under the same conditions as those for the superlattice layer 405. A semiconductor layer 410 is grown under the same conditions for the light guiding layer 408.

Next, the S molecular beam shutter is opened, and the intensity of N$_2$ radical beam is set to be $4\times10^{-9}$ Torr. A cladding layer 411 of p-type ZnS$_{0.07}$Se$_{0.93}$ is grown for 1.5 hours. Finally, a contact layer 412 of p$^+$-type ZnSe is formed under conditions that the S molecular beam shutter is closed and the intensity of N$_2$ radical beam is set to be $1\times10^{-8}$ Torr. In this way, an epitaxial wafer is obtained.

Thereafter, an insulating film 413 of polyimide is formed on the contact layer 412 of p$^+$-type ZnSe in the resulting epitaxial wafer. Then, a resist pattern (not shown) having a stripe shape with a width of 20 μm is formed by a photolithography technique, so that a contact hole 422 having a width of 20 μm is formed in the center portion of the device. Next, an electrode 414 of Au is formed on the contact layer 412 and the insulating film 413 by resistive heating evaporation, an electron beam deposition, or another method. Then, the resulting wafer is cleaved so as to obtain a laser pellet (not shown) having a size of 200 μm (resonator length)×300 μm (width)×250 μm (thickness). On the both facets of the resonator, Al$_2$O$_3$ or ZnS is deposited, so as to form a protective reflection film. The laser pellet is fixed to a Cu (heat sink) stem by melting metal in such a manner that the side of the stripe electrode is in contact with the stem. On the cathode side, In bonding is performed. Thus, a final laser device 34 is obtained.

The laser device 34 produced by the above method has a peak oscillation wavelength of 490 nm at 77K, and the oscillation threshold level is 10 mA at 77K in the CW operation. The voltage applied to the whole device is 4 V. By using the laser device 30, the time-sequence change of the light output during the driving at 77K and 50 mA was observed. As a result, it was found that the attenuation of the emission intensity can be suppressed as compared with the conventional structure, and a laser oscillation without change in the emission intensity for a longer time period by two figures.

Then, the laser device 34 and a conventional laser device after laser oscillation were cut along the (011) plane and observed with TEM. In the conventional device, the misfit dislocations caused by a lattice mismatch reached the active laser, so that the structure was locally destructed. In the laser device 34 of this example, all of the dislocations were suppressed by the superlattice layer, so that the active layer maintained its state before and after the oscillation.

Example 8

A group II-VI compound semiconductor device in the eighth example according to the invention will be described with reference to FIG. 15B.

Figure 15B:
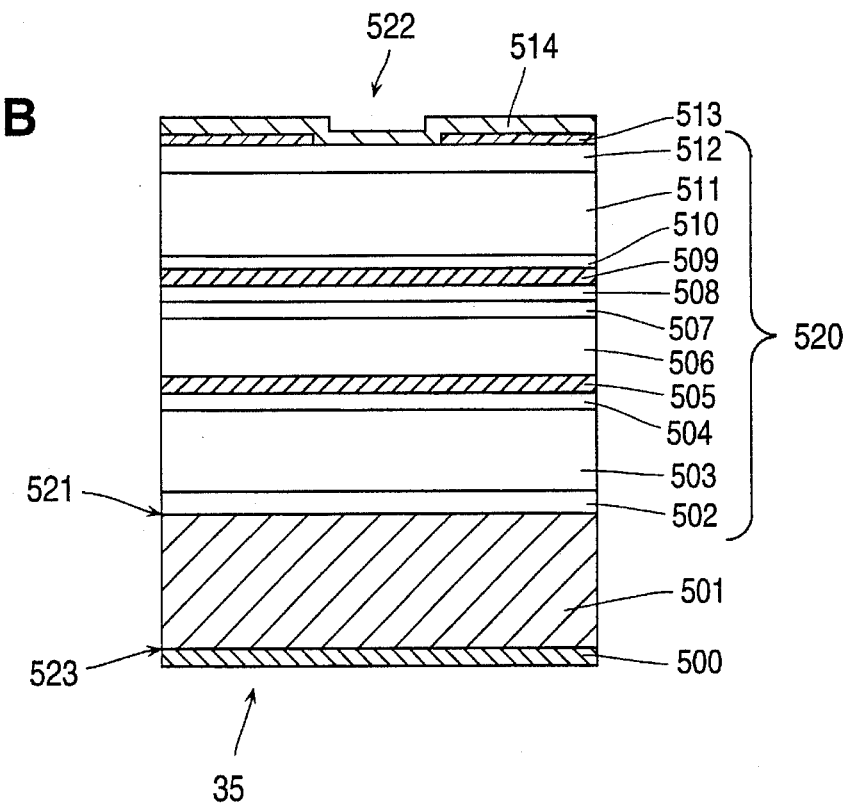
FIG. 15B is a cross-sectional view showing a construction of a group II-VI compound semiconductor laser device using a strained-layer superlattice according to Example 8 of the invention.

FIG. 15B schematically shows a cross section of a laser device 35 according to the invention. The laser device 35 includes a semiconductor substrate 501 and a semiconductor layered structure 520 formed thereon. The semiconductor substrate 501 is an n-type iodine doped ZnS$_{0.4}$Se$_{0.6}$ substrate having a main plane 521 of just (100) orientation (I concentration: $5\times10^{18}$ cm$^{-3}$).

The semiconductor layered structure 520 includes a contact layer 502 (thickness: 0.1 μm) formed on the semiconductor substrate 501, a cladding layer 503 (thickness: 4 μm) formed on the contact layer 502, and a semiconductor layer 504 (thickness: 0.1 μm) formed on the cladding layer 503. The contact layer 502, the cladding layer 503, and the semiconductor layer 504 are formed of n$^+$-type ZnS$_{0.4}$Se$_{0.6}$, n-type ZnS$_{0.4}$Se$_{0.6}$, and n-type ZnS$_{0.35}$Se$_{0.65}$, respectively, and they are doped with chlorine of $4\times10^{18}$ cm$^{-3}$, $1\times10^{18}$ cm$^{-3}$, and $1\times10^{17}$ cm$^{-3}$, respectively.

The semiconductor layered structure 520 further includes a superlattice layer 505 on the semiconductor layer 504 as a dislocation suppressing layer. The superlattice layer 505 has a layered structure in which ten n-type ZnS$_{0.45}$Se$_{0.55}$ layers and ten n-type ZnS$_{0.25}$Se$_{0.75}$ layers are alternately disposed. Each of the layers in the layered structure of the superlattice layer 505 has a thickness of 0.1 μm. Both of the n-type ZnS$_{0.45}$Se$_{0.55}$ layer and the n-type ZnS$_{0.25}$Se$_{0.75}$ layer are doped with chlorine of $1\times10^{17}$ cm$^{-3}$.

The semiconductor layered structure 520 further includes a light guiding layer 506 (thickness: 1 μm) formed on the superlattice layer 505, an active layer 507 (thickness: 10 nm) formed on the light guiding layer 506, and a light guiding layer 508 (thickness: 0.1 μm) formed on the active layer 507. The light guiding layers 506 and 508 are made of n-type $ZnS_{0.35}Se_{0.65}$, and p-type $Zn_{0.55}Cd_{0.45}S$, respectively, and they are doped with chlorine of $1\times10^{17}$ cm$^{-3}$ and nitrogen of $1\times10^{17}$ cm$^{-3}$, respectively. The active layer 507 is made of non-doped $Zn_{0.95}Cd_{0.05}S_{0.07}Se_{0.93}$.

The semiconductor layered structure 520 further includes a superlattice layer 509 on the light guiding layer 508 as a dislocation suppressing layer. The superlattice layer 509 has a layered structure in which ten p-type $Zn_{0.45}Cd_{0.55}S$ layers and ten p-type $ZnS_{0.65}Cd_{0.35}S$ layers are alternately disposed. Each of the layers in the layered structure of the superlattice layer 509 has a thickness of 0.1 μm. Both of the p-type $Zn_{0.45}Cd_{0.55}S$ layer and the p-type $Zn_{0.65}Cd_{0.35}S$ layer are doped with nitrogen of $1\times10^{17}$ cm$^{-3}$.

The semiconductor layered structure 520 further includes a semiconductor layer 510 (thickness: 0.1 μm) formed on the superlattice layer 509, a cladding layer 511 (thickness: 1.5 μm) formed on the semiconductor layer 510, and a contact layer 512 (thickness: 0.1 μm) formed on the cladding layer 511. The semiconductor layer 510, the cladding layer 511, and the contact layer 512 are made of p-type $Zn_{0.55}Cd_{0.45}S$, p-type $Zn_{0.6}Cd_{0.4}S$, and p$^+$-type $Zn_{0.6}Cd_{0.4}S$, respectively, and they are doped with nitrogen of $1\times10^{17}$ cm$^{-3}$, $2\times10^{17}$ cm$^{-3}$, and $1\times10^{18}$ cm$^{-3}$, respectively.

An insulating film 513 of polyimide is formed on the contact layer 512. An electrode 514 of Au is formed on the insulating film 513. The electrode 514 is electrically connected to the contact layer 512 so as to form an ohmic contact via a contact hole 522. On the other surface 523 of the semiconductor substrate 501 on which the above layers are not formed, an electrode 500 of indium is formed. The electrode 500 is electrically connected to the semiconductor substrate 501 so as to form an ohmic contact.

The cladding layer 503 has a lattice mismatch of 0.23% with the semiconductor layer 504. Specifically, $ZnS_{0.4}Se_{0.6}$ has a lattice mismatch of 0.23% with $ZnS_{0.35}Se_{0.65}$. Accordingly, misfit dislocations caused by such a lattice mismatch occur at the interface between the cladding layer 503 and the semiconductor layer 504. The semiconductor layer 510 has a lattice mismatch of 0.23% with the cladding layer 511. Specifically, $Zn_{0.55}Cd_{0.45}S$ has a lattice mismatch of 0.23% with $Zn_{0.6}Cd_{0.4}S$. Accordingly, misfit dislocations caused by such a lattice mismatch occur at the interface between the semiconductor layer 510 and the cladding layer 511. In this invention, the superlattice layers 505 and 509 are formed so that the misfit dislocations occurring at the interfaces do not affect the overlying layers. The superlattice layers 505 and 509 each have a layered structure of a plurality of thin semiconductor layers. By utilizing the strain feature of the respective thin semiconductor layers, the superlattice layers 505 and 509 can absorb the lattice mismatches. As a result, the light guiding layer 506 having fewer defects such as dislocations can be formed on the superlattice layer 505 without being affected by the misfit dislocations caused at the interface between the cladding layer 503 and the semiconductor layer 504. By providing the superlattice layers 505 and 509 between the semiconductor layers 504 and 510, and by providing the active layer 507 between the superlattice layers 505 and 509, the occurrence of defects such as misfit dislocations can be reduced in the active layer 507.

In the laser device 35, electrons and holes are confined in the active layer 507. Specifically, the cladding layer 511 of p-type $Zn_{0.6}Cd_{0.4}S$ and the semiconductor layer 510 of p-type $Zn_{0.55}Cd_{0.45}S$ inject holes into the active layer 507 of $Zn_{0.95}Cd_{0.05}S_{0.07}Se_{0.93}$, and the cladding layer 503 of n-type $ZnS_{0.4}Se_{0.6}$ and the semiconductor layer 504 of n-type $ZnS_{0.35}Se_{0.65}$ inject electrons into the active layer 507.

The active layer 507 of $Zn_{0.95}Cd_{0.05}S_{0.07}Se_{0.93}$ has large lattice mismatches with the light guiding layer 506 of $ZnS_{0.35}Se_{0.65}$ and the light guiding layer 508 of $Zn_{0.55}Cd_{0.45}S$. However, the thickness of the active layer 507 is set to be 10 nm or less, so that the lattice mismatches can exist while including strains but not causing defects such as dislocations. When the electrons and holes are combined in the active layer 507, laser light is emitted. Since the active layer 507 is thin, most of the emitted light permeates into the light guiding layers 506 and 508 which interposes the active layer 507. The permeating light is confined in the semiconductor layers 504 to 510 between the cladding layer 503 and 511. In the semiconductor layered structure 520 of the laser device 35, the construction of the semiconductor layers 508 to 512 over the active layer 507 and the construction of the semiconductor layers 506 to 501 under the active layer 507 are asymmetric with respect to the active layer 507. Specifically, the thickness of the light guiding layer 508 is 0.1 μm, while the thickness of the light guiding layer 506 is 1 μm. Therefore, the center of the intensity distribution of the emitted light exists in the light guiding layer 506. This means that the layer in which the holes and the electrons are recombined is different from the layer which is the center of light emission. As a result, the active layer 507 which is thermally unstable is prevented from causing to having a high temperature. Therefore, the laser device 35 can stably emit laser light for a long time. In this example, it is designed such that the light emission center exists in the light guiding layer 506 of n-type conductivity. It is easily understood that the light emission center may exist in the light guiding layer 508 of p-type conductivity.

The fabrication of the laser device 35 is substantially the same as that of the laser device 35 except for the molecular beam intensities, so that the detailed description is omitted.

The laser device 35 produced by the above method has a peak oscillation wavelength of 460 nm at 77K, and the oscillation threshold level is 15 mA at 77K in the CW operation. The voltage applied to the whole device is 5 V. By using the laser device 35, the time-sequence change of the light output during the driving at 77K and 50 mA was observed. As a result, it was found that the attenuation of the emission intensity can be suppressed as compared with the conventional structure, and a laser oscillation without change in the emission intensity for a longer time period by two figures.

As is understood from Examples 1 and 2, the invention is not limited to a ZnSSe layer and a ZnCdS layer each having a specific mixed crystal ratio. By appropriately selecting thicknesses of superlattice layers and a combination thereof, the present invention is applicable to almost all ZnCdSSe-based materials which is a lattice mismatch system.

Example 9

A group II-VI compound semiconductor device in the ninth example according to the invention will be described with reference to FIG. 15C.

Figure 15C:
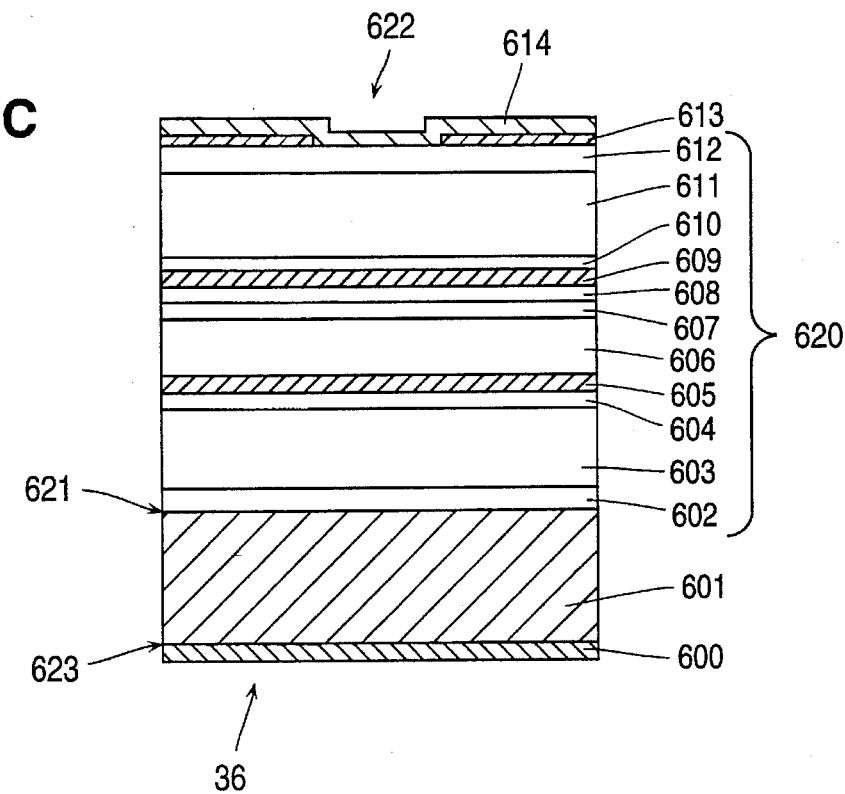
FIG. 15C is a cross-sectional view showing a construction of a group II-VI compound semiconductor laser device using a strained-layer superlattice according to Example 9 of the invention.
Figure 16:
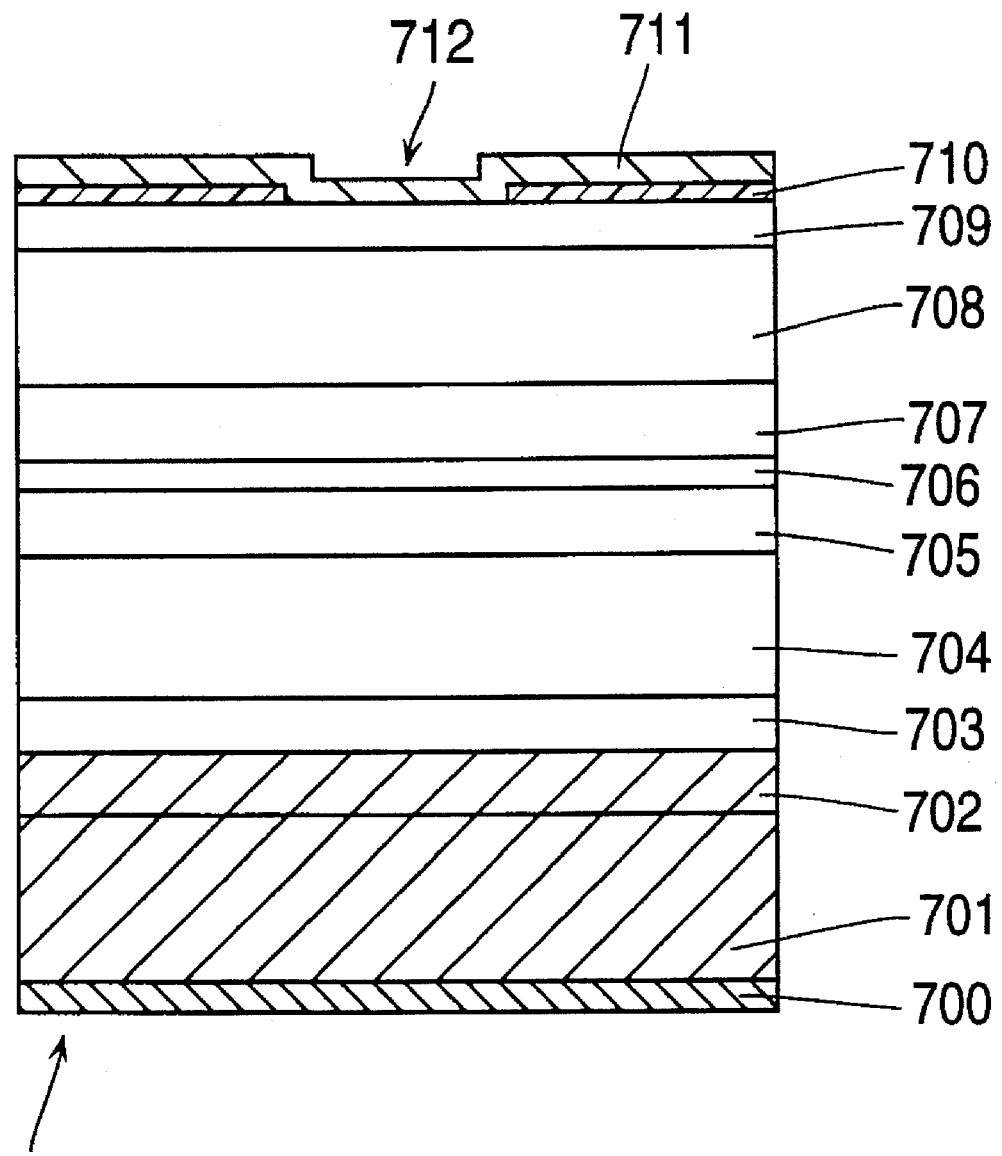
FIG. 16 is a cross-sectional view showing a construction of a conventional group II-VI compound semiconductor laser device.

FIG. 15C schematically shows a cross section of a laser device 36 according to the invention. The laser device 36 includes a semiconductor substrate 601 and a semiconductor layered structure 620 formed thereon. The semiconductor substrate 601 is an n-type GaAs (100) substrate having a main plane 621 with an off angle of 5 degrees in the [011] direction.

The semiconductor layered structure 620 includes a contact layer 602 (thickness: 0.1 μm) formed on the semiconductor substrate 601, a cladding layer 603 (thickness: 4 μm) formed on the contact layer 602, and a semiconductor layer 604 (thickness: 0.1 μm) formed on the cladding layer 603. The contact layer 602, the cladding layer 603, and the semiconductor layer 604 are formed of n⁺-type $ZnS_{0.07}Se_{0.93}$, n-type $ZnS_{0.07}Se_{0.93}$, and n-type ZnSe, respectively, and they are doped with chlorine of $4\times10^{18}$ cm$^{-3}$, $1\times10^{18}$ cm$^{-3}$, and $1\times10^{17}$ cm$^{-3}$, respectively.

The semiconductor layered structure 620 further includes a superlattice layer 605 on the semiconductor layer 604 as a dislocation suppressing layer. The superlattice layer 605 has a layered structure in which ten n-type ZnSe layers and ten n-type $ZnS_{0.07}Se_{0.93}$ layers are alternately disposed. Each of the layers in the layered structure of the superlattice layer 605 has a thickness of 0.1 μm. Both of the n-type ZnSe layer and the n-type $ZnS_{0.07}Se_{0.93}$ layer are doped with chlorine of $1\times10^{17}$ cm$^{-3}$.

The semiconductor layered structure 620 further includes a light guiding layer 606 (thickness: 1 μm) formed on the superlattice layer 605, an active layer 607 (thickness: 14 nm) formed on the light guiding layer 606, and a light guiding layer 608 (thickness: 0.1 μm) formed on the active layer 607. The light guiding layers 606 and 608 are made of n-type ZnSe, and p-type ZnSe, respectively, and they are doped with chlorine of $1\times10^{17}$ cm$^{-3}$ and nitrogen of $1\times10^{17}$ cm$^{-3}$, respectively. The active layer 607 is made of non-doped $Zn_{0.8}Cd_{0.2}Se$.

The semiconductor layered structure 620 further includes a superlattice layer 609 on the light guiding layer 608 as a dislocation suppressing layer. The superlattice layer 609 has a layered structure in which ten p-type ZnSe layers and ten p-type $ZnS_{0.07}Se_{0.93}$ layers are alternately disposed. Each of the layers in the layered structure of the superlattice layer 609 has a thickness of 0.1 μm. Both of the p-type ZnSe layer and the p-type $Zn_{0.07}Se_{0.93}$ layer are doped with nitrogen of $1\times10^{17}$ cm$^{-3}$.

The semiconductor layered structure 620 further includes a semiconductor layer 610 (thickness: 0.1 μm) formed on the superlattice layer 609, a cladding layer 611 (thickness: 1.5 μm) formed on the semiconductor layer 610, and a contact layer 612 (thickness: 0.1 μm) formed on the cladding layer 611. The semiconductor layer 610, the cladding layer 611, and the contact layer 612 are made of p-type ZnSe, p-type $ZnS_{0.07}Se_{0.93}$, and p⁺-type ZnSe, respectively, and they are doped with nitrogen of $1\times10^{17}$ cm$^{-3}$, $2\times10^{17}$ cm$^{-3}$, and $1\times10^{18}$ cm$^{-3}$, respectively.

An insulating film 613 of polyimide is formed on the contact layer 612. An electrode 614 of Au is formed on the insulating film 613. The electrode 614 is electrically connected to the contact layer 612 so as to form an ohmic contact via a contact hole 622. On the other surface 623 of the semiconductor substrate 601 on which the above layers are not formed, an electrode 600 of indium is formed. The electrode 600 is electrically connected to the semiconductor substrate 601 so as to form an ohmic contact.

The contact layer 602 of $ZnS_{0.07}Se_{0.93}$ has a lattice match with the semiconductor substrate 601 of GaAs. The cladding layer 603 and the semiconductor layer 610 have lattice mismatches of 0.26% with the semiconductor layer 604 and the cladding layer 611, respectively. mismatch of 0.26% with ZnSe. Accordingly, misfit dislocations caused by such lattice mismatches occur at the interface between the cladding layer 603 and the semiconductor layer 604 and at the interface between the semiconductor layer 610 and the cladding layer 611. In this invention, the semiconductor substrate 601 with an off angle causes a misorientation at the interface, so as to reduce the strains at the mismatched interfaces (between 603 and 604, between 610 and 611). As a result, lattice defects can be suppressed. Moreover, the superlattice layers 605 and 609 are formed so that the misfit dislocations occurring at the interfaces do not affect the overlying layers. The superlattice layers 605 and 609 each have a layered structure of a plurality of thin semiconductor layers. By utilizing the strain feature of the respective thin semiconductor layers, the superlattice layers 605 and 609 can absorb the lattice mismatches. As a result, the light guiding layer 606 having fewer defects such as dislocations can be formed on the superlattice layer 605 without being affected by the misfit dislocations caused at the interface between the cladding layer 603 and the semiconductor layer 604. By providing the superlattice layers 605 and 609 between the semiconductor layers 604 and 610, and by providing the active layer 607 between the superlattice layers 605 and 609, the occurrence of defects such as misfit dislocations can be reduced in the active layer 607.

In the laser device 36, electrons and holes are confined in the active layer 607. Specifically, the cladding layer 611 of p-type $ZnS_{0.07}Se_{0.93}$ and the semiconductor layer 610 of p-type ZnSe inject holes into the active layer 607 of $Zn_{0.8}Cd_{0.2}Se$, and the cladding layer 603 of n-type $ZnS_{0.07}Se_{0.93}$ and the semiconductor layer 604 of n-type ZnSe inject electrons into the active layer 607.

The active layer 607 of $Zn_{0.8}Cd_{0.2}Se$ has large lattice mismatches with the light guiding layers 606 and 608 of ZnSe. However, the thickness of the active layer 607 is set to be 14 nm or less, so that the lattice mismatches can exist while including strains but not causing defects such as dislocations. When the electrons and holes are combined in the active layer 607, laser light is emitted. Since the active layer 607 is thin, most of the emitted light permeates into the light guiding layers 606 and 608 which interposes the active layer 607. The permeating light is confined in the semiconductor layers 604 to 610 between the cladding layer 603 and 611. In the semiconductor layered structure 620 of the laser device 36, the construction of the semiconductor layers 608 to 612 over the active layer 607 and the construction of the semiconductor layers 606 to 601 under the active layer 607 are asymmetric with respect to the active layer 607. Specifically, the thickness of the light guiding layer 608 is 0.1 μm, while the thickness of the light guiding layer 606 is 1 μm. Therefore, the center of the intensity distribution of the emitted light exists in the light guiding layer 606. This means that the layer in which the holes and the electrons are recombined is different from the layer which is the center of light emission. As a result, the active layer 607 which is thermally unstable is prevented from causing to be a high temperature. Therefore, the laser device 36 can stably emit laser light for a long time. In this example, it is designed such that the light emission center exists in the light guiding layer 608 of p-type conductivity. It is understood that the light emission center may exist in the light guiding layer 606 of n-type conductivity.

The fabrication of the laser device 36 is substantially the same as that of the laser device 34 or 35 except for the use of an n-type silicon doped GaAs substrate (Si concentration: $4\times10^{18}$ cm$^{-3}$) of (100) orientation with an off angle of 5 degrees in the [011] direction, so that the detailed description is omitted.

The laser device 36 produced by the above method has a peak oscillation wavelength of 493 nm at 77K, and the oscillation threshold level is 9 mA at 77K in the CW operation. The voltage applied to the whole device is 4 V. By using the laser device 36, the time-sequence change of the light output during the driving at 77K and 50 mA was observed. As a result, it was found that the attenuation of the emission intensity can be suppressed as compared with the conventional structure, and a laser oscillation without change in the emission intensity for a longer time period by two figures.

Then, the laser device 36 and a conventional laser device after laser oscillation were cut along the (011) plane and observed with TEM. In the conventional device, the misfit dislocations caused by a lattice mismatch reached the active laser, so that the structure was locally destructed. In the laser device 36 of this example, all of the dislocations were suppressed by the misfit interface having misorientation and the superlattice layer, so that the active layer maintained its state before and after the oscillation.

As is understood from Examples 1 and 2, the invention is not limited to a ZnSSe layer and a ZnCdS layer each having a specific mixed crystal ratio. By appropriately selecting thicknesses of superlattice layers and a combination thereof, the present invention is applicable to almost all ZnCdSSe-based materials which is a lattice mismatch system.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor thin film including the step of epitaxially growing a semiconductor layer made of a group II-VI compound semiconductor to have a thickness of at least one atomic layer or more, on a main plane of a single-crystal semiconductor substrate, the semiconductor substrate having one of a diamond structure and a zinc blende structure and being lattice-mismatched with the semiconductor layer, the main plane being inclined by an angle in the range of 2 to 16 degrees with respect to a (100) plane, wherein substantial misorientation occurs between the single-crystal semiconductor substrate and the semiconductor layer along a direction of inclination of the main plane.

2. A method for fabricating a semiconductor thin film including the step of epitaxially growing a semiconductor layer made of a group II-VI compound semiconductor to have a thickness of at least one atomic layer or more, on a main plane of a single-crystal semiconductor substrate, the semiconductor substrate having one of a diamond structure and a zinc blende structure, the main plane being inclined by an angle in the range of 2 to 16 degrees with respect to a (100) plane, wherein the main plane is a (511) plane.

3. A light emitting device made of group II-VI compound semiconductors, the device comprising:

a single-crystal semiconductor substrate having a main plane and having one of a diamond structure and a zinc blende structure, the main plane being inclined by an angle in the range of 2 to 16 degrees with respect to a (100) plane; and a semiconductor layered structure including at least one or more semiconductor layers which is epitaxially grown on the semiconductor substrate, the semiconductor layers being made of group II-VI compound semiconductors and being lattice-mismatched with the single-crystal semiconductor substrate, wherein substantial misorientation occurs between the single-crystal semiconductor substrate and the semiconductor layers along a direction of inclination of the main plane.

4. A light emitting device according to claim 3, wherein the main plane is a (511) plane.

5. A light emitting device made of group II-VI compound semiconductors, the device comprising:

a semiconductor substrate; and a semiconductor layered structure including at least an active layer for recombining electrons with holes, wherein in the semiconductor layered structure, an intensity distribution of light emitted from the active layer along a direction perpendicular to the semiconductor substrate is asymmetric with respect to the active layer, thereby locating the maximum region of the intensity distribution of the light generated by the recombination outside the active layer.

6. A light emitting device made of group II-VI compound semiconductors, the device comprising:

a semiconductor substrate; and a semiconductor layered structure including at least an active layer for recombining electrons with holes and two light guiding layers formed to interpose at least the active layer, the light guiding layers having different thicknesses, thereby locating the maximum region of intensity distribution of light generated by the recombination outside the active layer.

7. A light emitting device made of group II-VI compound semiconductors, the device comprising:

a semiconductor substrate; and a semiconductor layered structure including an active layer for recombining electrons with holes, two light guiding layers formed to interpose the active layer, and two dislocation suppressing layers formed to interpose the two light guiding layers for suppressing dislocations.

8. A light emitting device according to claim 7, wherein the two dislocation suppressing layers are strained-layer superlattice.

9. A light emitting device according to claim 3, wherein the semiconductor layered structure further includes at least an active layer for recombining electrons with holes, wherein in the semiconductor layered structure, an intensity distribution of light emitted from the active layer along a direction perpendicular to the semiconductor substrate is asymmetric with respect to the active layer, thereby locating the maximum region of the intensity distribution of the light generated by the recombination outside the active layer.

10. A light emitting device according to claim 3, wherein the semiconductor layered structure further includes two light guiding layers formed to interpose at least the active layer, the light guiding layers having different thicknesses, thereby locating the maximum region of intensity distribution of light generated by the recombination outside the active layer.

11. A light emitting device according to claim 3, wherein the semiconductor layered structure further includes an active layer for recombining electrons with holes, two light guiding layers formed to interpose the active layer, and two dislocation suppressing layers formed to interpose the two light guiding layers for suppressing dislocations.

12. A light emitting device according to claim 11, wherein the two dislocation suppressing layers are strained-layer superlattice.

13. A light emitting device made of group II-VI compound semiconductors, the device comprising:

a single-crystal semiconductor substrate having a main plane and having one of a diamond structure and a zinc blende structure, the main plane being inclined by an angle in the range of 2 to 16 degrees with respect to a (100) plane; and a semiconductor layered structure including at least one or more semiconductor which is epitaxially grown on the semiconductor substrate, the semiconductor layers being made of group II-VI compound semiconductors, wherein the main plane is a (511) plane.

14. A method according to claim 1, wherein the direction of inclination of the main plane is a <110> direction.

15. A light emitting device according to claim 3, wherein the direction of inclination of the main plane is a <110> direction.

16. A method according to claim 1, wherein the direction of inclination of the main plane is an off-angle direction.

17. A light emitting device according to claim 3, wherein the direction of inclination of the main plane is an off-angle direction.

* * * * *